(12) United States Patent
Karyu et al.

(10) Patent No.: US 12,354,945 B2
(45) Date of Patent: Jul. 8, 2025

(54) MEMORY DEVICE COMPRISING VARIOUS CONDUCTORS/MEMBERS IN BRIDGE REGION AND MEMORY REGION OF A MEMORY DEVICE

(71) Applicant: Kioxia Corporation, Tokyo (JP)

(72) Inventors: Nozomi Karyu, Yokkaichi (JP); Genki Kawaguchi, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 588 days.

(21) Appl. No.: 17/669,822

(22) Filed: Feb. 11, 2022

(65) Prior Publication Data

US 2023/0079009 A1 Mar. 16, 2023

(30) Foreign Application Priority Data

Sep. 16, 2021 (JP) .................. 2021-151370

(51) Int. Cl.
*H01L 23/522* (2006.01)
*H10B 43/27* (2023.01)
*H10B 43/40* (2023.01)

(52) U.S. Cl.
CPC ......... *H01L 23/5226* (2013.01); *H10B 43/27* (2023.02); *H10B 43/40* (2023.02)

(58) Field of Classification Search
CPC ........ H10B 41/27; H10B 41/40; H10B 43/27; H10B 43/40; H01L 23/5226

USPC .......................................... 257/737; 438/613
See application file for complete search history.

(56) References Cited

U.S. PATENT DOCUMENTS

| 10,553,603 | B2 | 2/2020 | Yamashita |
| 2018/0247951 | A1 | 8/2018 | Fujii et al. |
| 2019/0088672 | A1* | 3/2019 | Tomimatsu ....... H01L 21/76877 |
| 2020/0303300 | A1* | 9/2020 | Kato ................. H01L 23/5283 |

FOREIGN PATENT DOCUMENTS

JP 2019-160922 A 9/2019

* cited by examiner

*Primary Examiner* — Didarul A Mazumder
(74) *Attorney, Agent, or Firm* — Oblon, McClelland, Maier & Neustadt, L.L.P.

(57) ABSTRACT

A memory device includes: a substrate having a memory region and an external region; a first conductor, in the memory region, being arranged apart from the substrate in a first direction; second and third conductors, in the external region, being arranged apart from the first conductor in a second direction; a first member between the first and second conductors; a second member between the second and third conductors; and an insulating member between the first and second members. The first and second members each includes a lower portion extending in the first direction and reaching below the second conductor and an upper portion having a side surface outside an extension of a side surface of the lower portion. The insulating member includes lower and upper ends located below and above each of the upper portions, respectively.

19 Claims, 25 Drawing Sheets

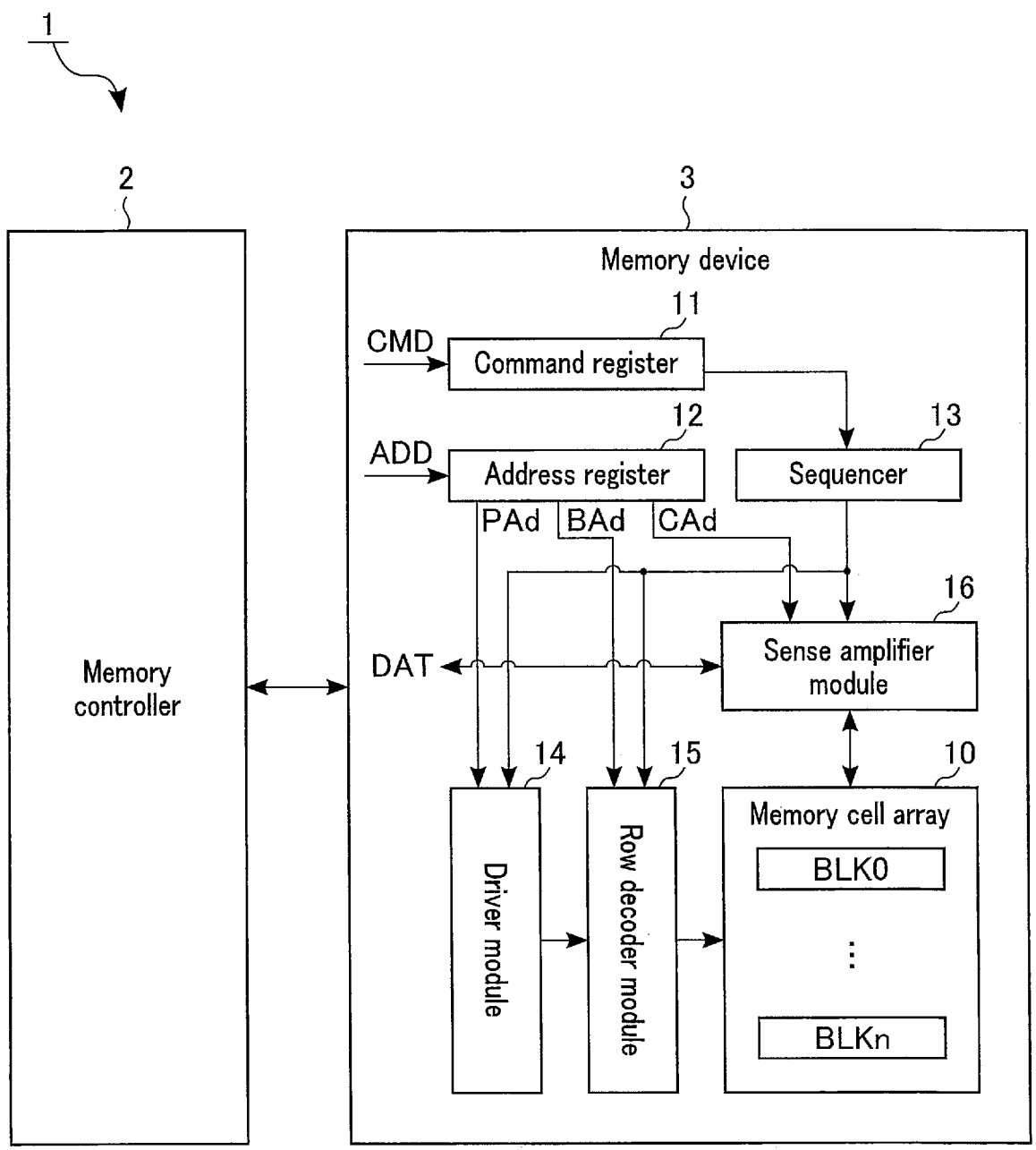
F I G. 1

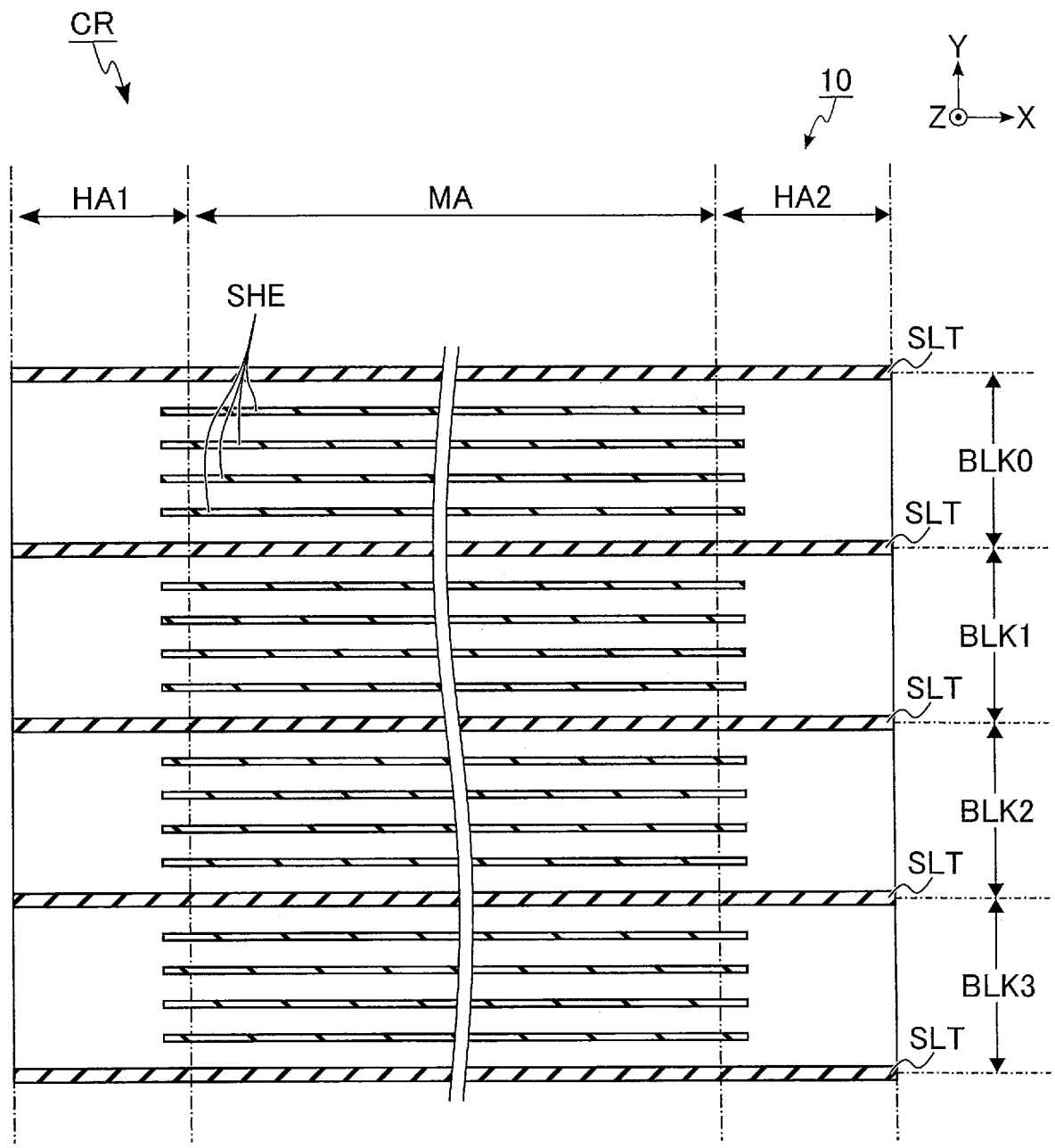
F I G. 4

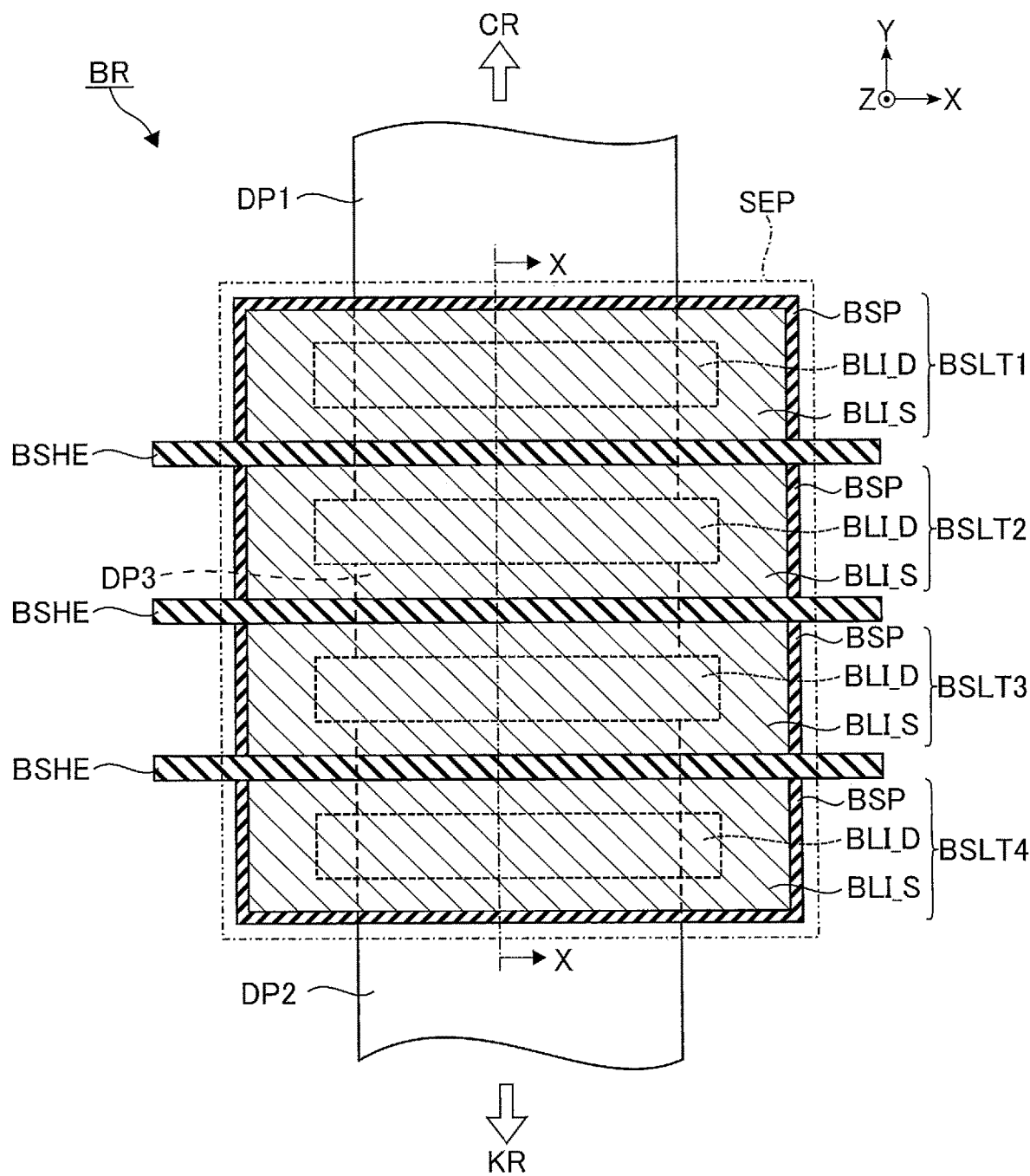
F I G. 9

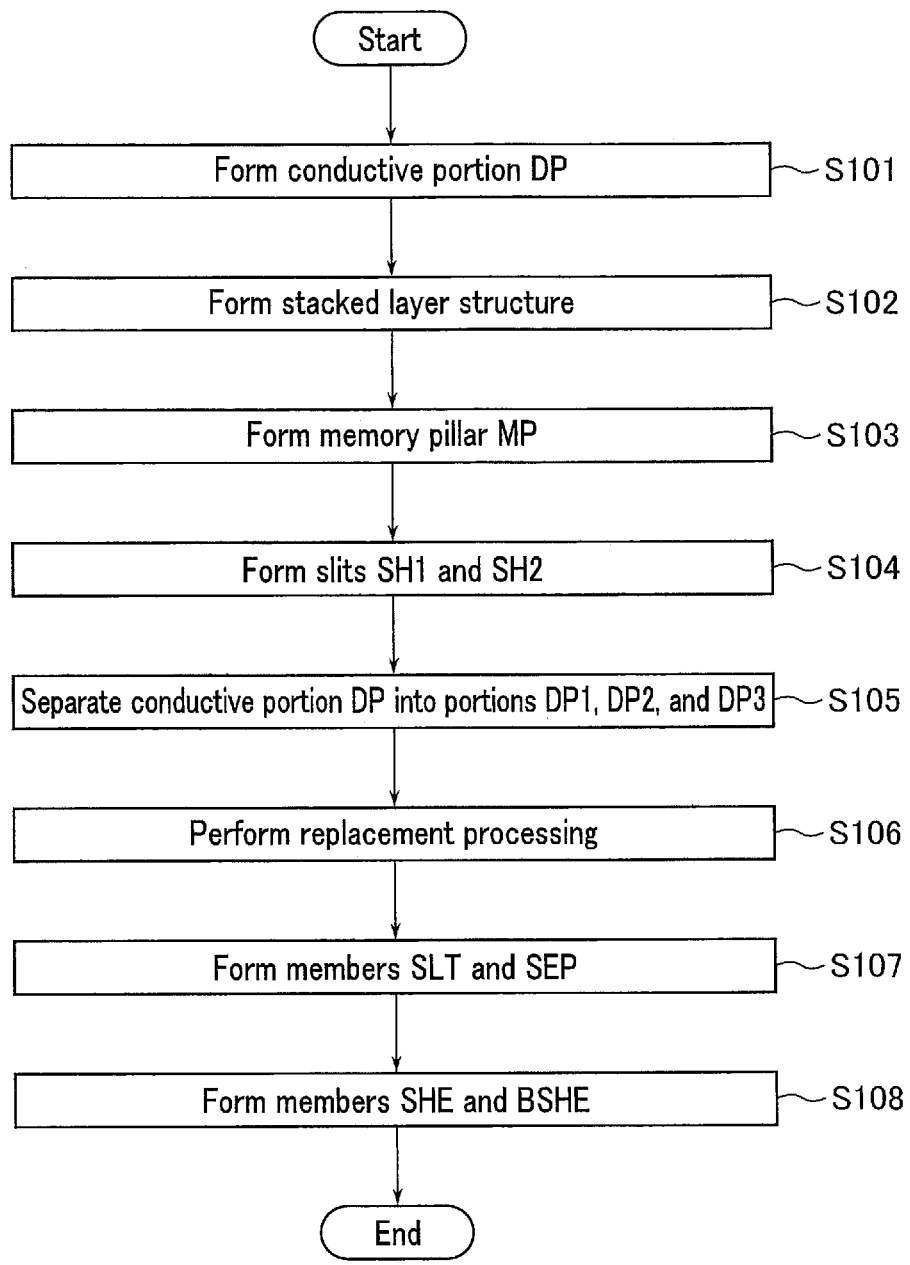
F I G. 11

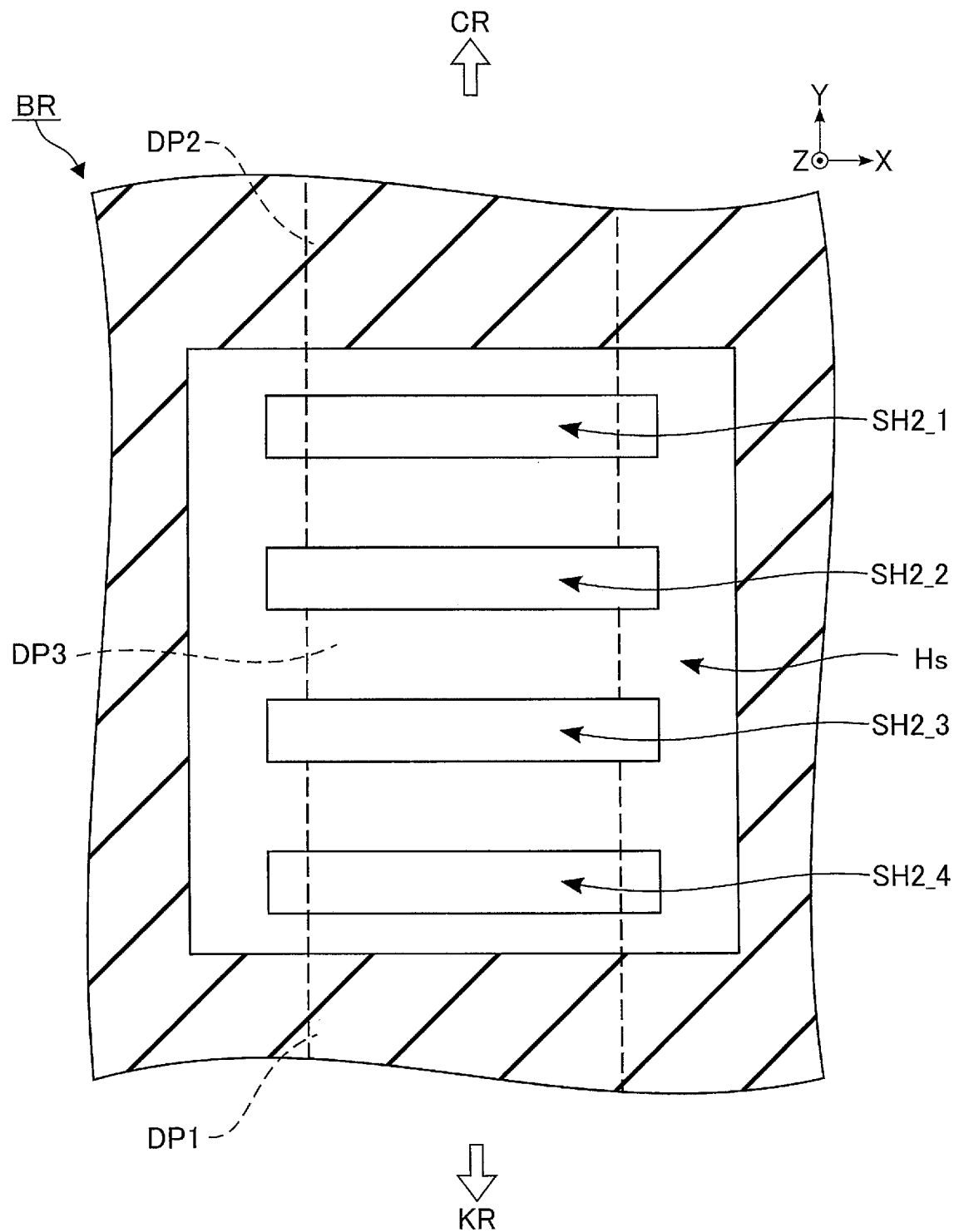
F I G. 19

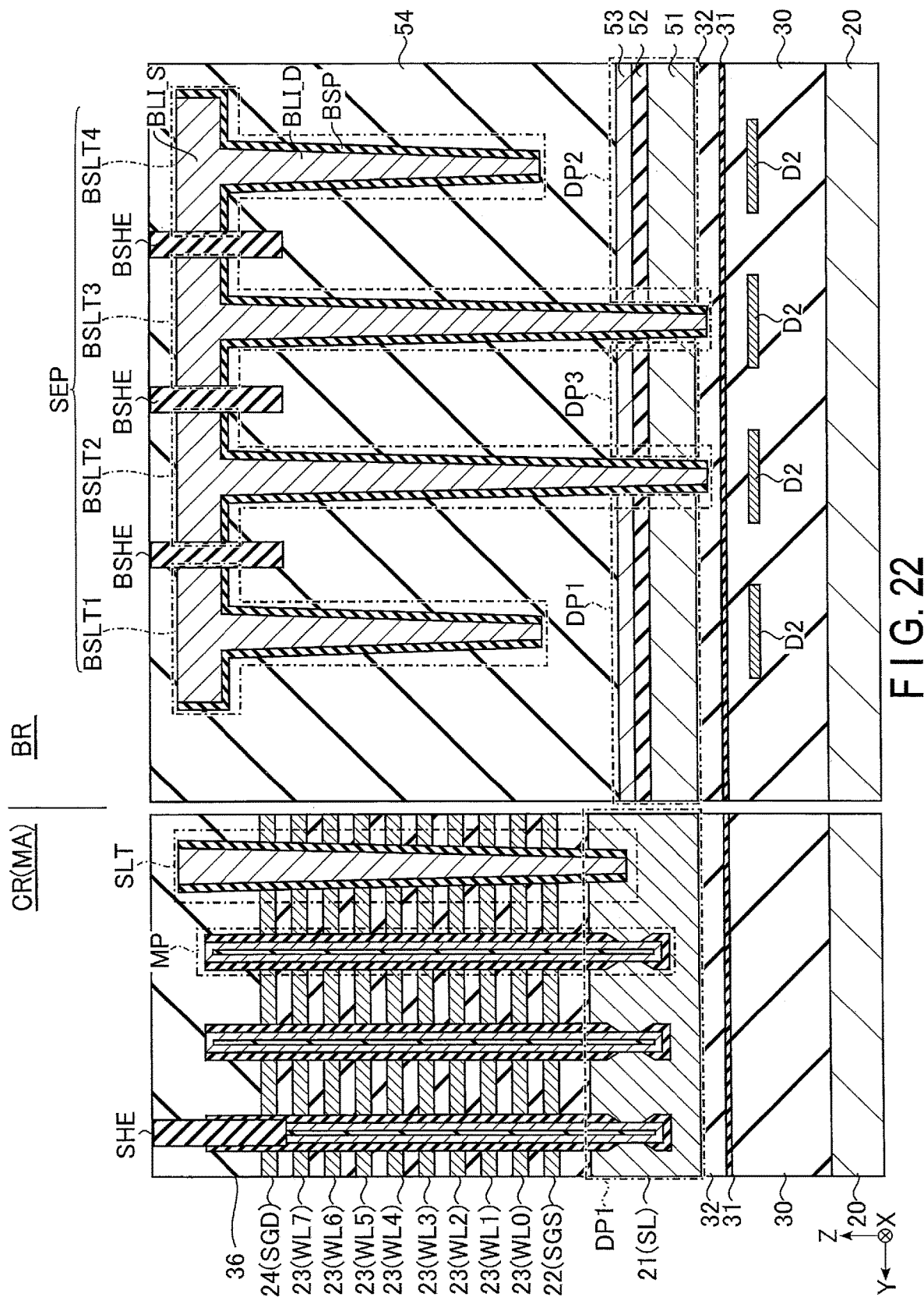
F I G. 22

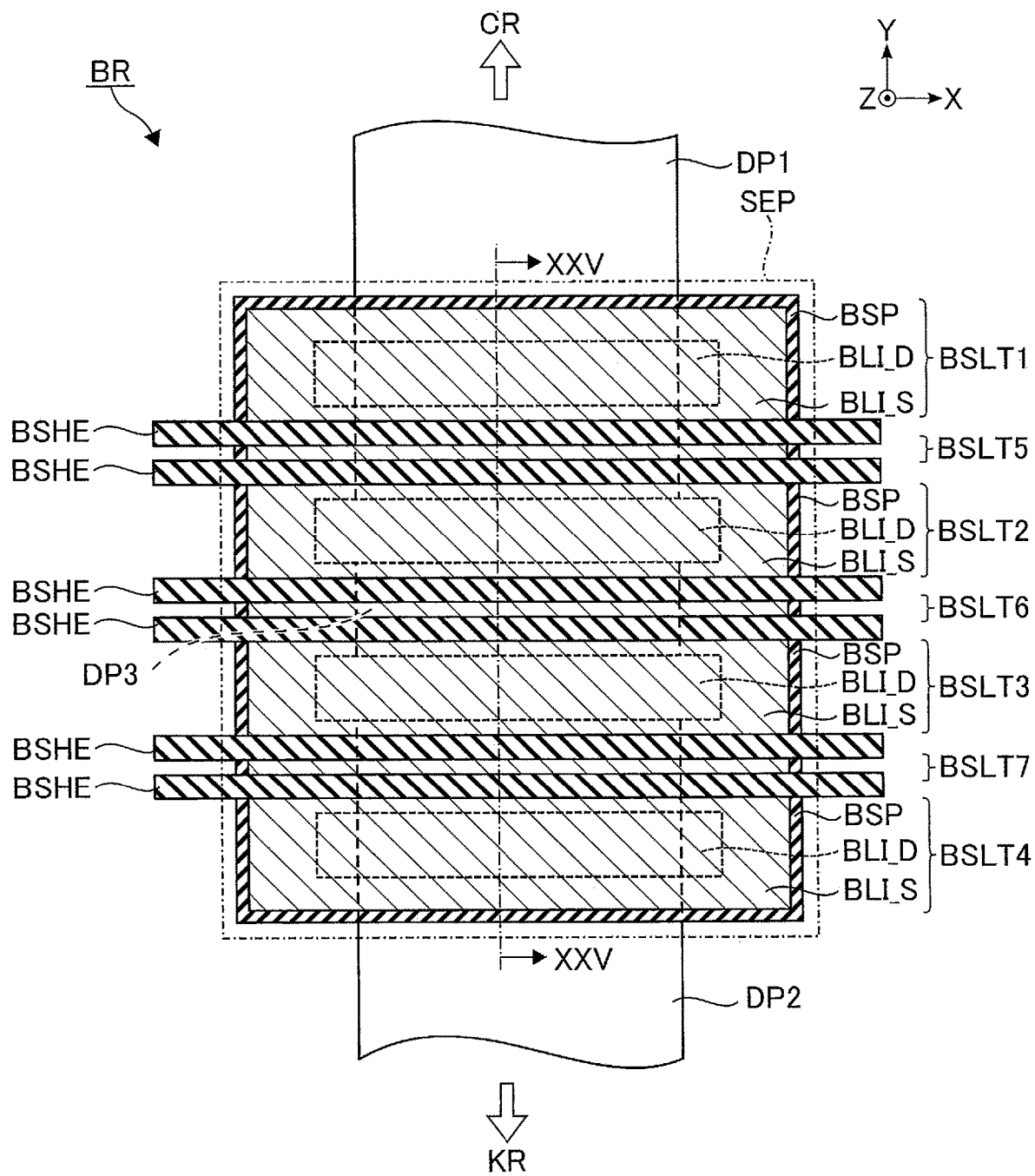
F I G. 24

MEMORY DEVICE COMPRISING VARIOUS CONDUCTORS/MEMBERS IN BRIDGE REGION AND MEMORY REGION OF A MEMORY DEVICE

CROSS-REFERENCE TO RELATED APPLICATIONS

This application is based upon and claims the benefit of priority from the Japanese Patent Application No. 2021-151370, filed Sep. 16, 2021, the entire contents of which are incorporated herein by reference.

FIELD

Embodiments described herein relate generally to a memory device.

BACKGROUND

As a memory device capable of nonvolatilely storing data, a NAND flash memory is known. A memory device such as a NAND flash memory employs a three-dimensional memory structure to increase the capacity and the degree of integration.

BRIEF DESCRIPTION OF THE DRAWINGS

FIG. 1 is a block diagram showing an example of the configuration of a memory system including a memory device according to the first embodiment;

FIG. 4 is a plan view showing an example of a planar layout in the core region of the memory device according to the first embodiment;

FIG. 9 is a plan view showing an example of a planar layout in the bridge region of the memory device according to the first embodiment;

FIG. 11 is a flowchart showing an example of the manufacturing method of the memory device according to the first embodiment;

FIG. 19 is a plan view showing an example of the planar layout halfway through the manufacturing of the memory device according to the first embodiment;

FIG. 22 is a sectional view showing an example of the sectional structure halfway through the manufacturing of the memory device according to the first embodiment;

FIG. 24 is a plan view showing an example of a planar layout in the bridge region of a memory device according to the second embodiment;

DETAILED DESCRIPTION

Figure 2:
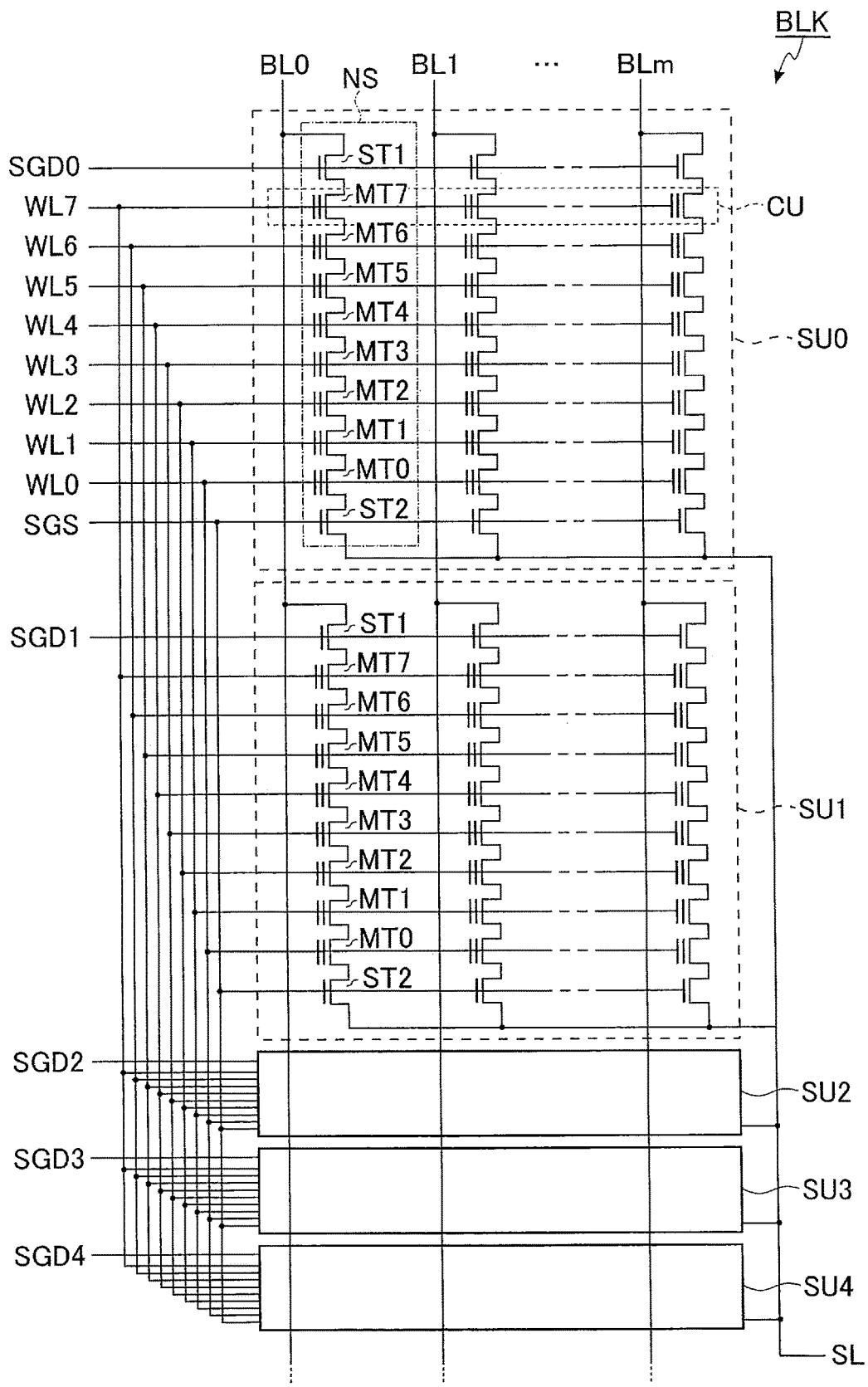
FIG. 2 is a circuit diagram showing an example of the circuit configuration of a memory cell array provided in the memory device according to the first embodiment.

In general, according to one embodiment, a memory device includes a substrate, a first conductor layer, a second conductor layer, a third conductor layer, a first member, a second member, and a first insulating member. The substrate includes a memory region, and an external region of the memory region. The first conductor layer is arranged, in the memory region, apart from the substrate in a first direction crossing a plane parallel to the substrate. The second conductor layer is arranged, in the external region, apart from the first conductor layer in a second direction in the plane. The third conductor layer is arranged, in the external region, apart from the second conductor layer on an opposite side of the first conductor layer with respect to the second conductor layer in the second direction. The first member includes, in the external region, a first lower portion and a first upper portion. The first lower portion extends in the first direction between the first conductor layer and the second conductor layer. The first lower portion reaches a lower side of the first conductor layer and the second conductor layer. The first upper portion includes a side surface outside an extension of a side surface of the first lower portion on an upper side of the first lower portion. The second member includes, in the external region, a second lower portion and a second upper portion. The second lower portion extends in the first direction between the second conductor layer and the third conductor layer. The second lower portion reaches a lower side of the second conductor layer and the third conductor layer. The second upper portion includes a side surface outside an extension of a side surface of the second lower portion on an upper side of the second lower portion. The second member is arranged apart from the first member in the second direction. The first insulating member includes, in the external region, a lower end and an upper end. The lower end is located on a lower side of the first upper portion and the second upper portion. The upper end is located on an upper side of the first upper portion and the second upper portion. The first insulating member extends in the first direction between the first upper portion and the second upper portion.

Embodiments will now be described with reference to the accompanying drawings. Dimensions and ratios in the drawings do not necessarily match the actuality.

Note that in the following description, the same reference numerals denote constituent elements having almost the same functions and configurations. To particularly discriminate elements having the same configuration, characters or numbers different from each other may be added to the end of the same reference numeral.

1. First Embodiment 1.1 Configuration
1.1.1 Memory System

FIG. 1 is a block diagram showing an example of the configuration of a memory system including a memory device according to the first embodiment. The memory system 1 is a storage device configured to be connected to an external host apparatus (not shown). The memory system 1 is, for example, a memory card such as an SD™ card, a UFS (Universal Flash Storage), and an SSD (Solid State Drive). The memory system 1 includes a memory controller 2 and a memory device 3.

The memory controller 2 is formed by, for example, an integrated circuit such as an SoC (System-on-a-Chip). The memory controller 2 controls the memory device 3 based on a request from the host apparatus. More specifically, for example, the memory controller 2 writes data write-requested by the host apparatus to the memory device 3. Also, the memory controller 2 reads out data read-requested by the host apparatus from the memory device 3 and transmits it to the host apparatus.

The memory device 3 is a nonvolatile memory. The memory device 3 is, for example, a NAND flash memory. The memory device 3 nonvolatilely stores data.

Communication between the memory controller 2 and the memory device 3 is based on, for example, an SDR (Single Data Rate) interface, a toggle DDR (Double Data Rate) interface, or an ONFI (Open NAND Flash Interface).

1.1.2 Memory Device

The internal configuration of the memory device according to the first embodiment will continuously be described with reference to the block diagram shown in FIG. 1. The memory device 3 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n is an integer of 1 or more). The number of blocks BLK included in the memory cell array 10 may be 1. The block BLK is a set of a plurality of memory cells. The block BLK is used as, for example, a data erase unit. Also, the memory cell array 10 is provided with a plurality of bit lines and a plurality of word lines. Each memory cell is associated with, for example, one bit line and one word line. The detailed configuration of the memory cell array 10 will be described later.

The command register 11 stores a command CMD that the memory device 3 receives from the memory controller 2. The command CMD includes, for example, an instruction for causing the sequencer 13 to execute a read operation, a write operation, an erase operation, or the like.

The address register 12 stores address information ADD that the memory device 3 receives from the memory controller 2. The address information ADD includes, for example, a block address BAd, a page address PAd, and a column address CAd. For example, the block address BAd, the page address PAd, and the column address CAd are used to select the block BLK, a word line, and a bit line, respectively.

The sequencer 13 controls the operation of the entire memory device 3. For example, the sequencer 13 controls the driver module 14, the row decoder module 15, the sense amplifier module 16, and the like based on the command CMD held in the command register 11, thereby executing the write operation, the read operation, the erase operation, and the like.

The driver module 14 generates a voltage to be used in the read operation, the write operation, the erase operation, or the like. Based on, for example, the page address PAd stored in the address register 12, the driver module 14 applies the generated voltage to a signal line corresponding to a selected word line.

Based on the block address BAd stored in the address register 12, the row decoder module 15 selects one corresponding block BLK in the memory cell array 10. The row decoder module 15 transfers, for example, the voltage applied to the signal line corresponding to the selected word line to the selected word line in the selected block BLK.

In the write operation, the sense amplifier module 16 applies a desired voltage to each bit line in accordance with write data DAT received from the memory controller 2. Also, in the read operation, the sense amplifier module 16 determines data stored in a memory cell based on the voltage of a bit line, and transfers the determination result as the read data DAT to the memory controller 2.

1.1.3 Circuit Configuration of Memory Cell Array

FIG. 2 is a circuit diagram showing an example of the circuit configuration of the memory cell array provided in the memory device according to the first embodiment. FIG. 2 shows one block BLK of the plurality of blocks BLK included in the memory cell array 10. As shown in FIG. 2, the block BLK includes, for example, five string units SU0 to SU4.

Each string unit SU includes a plurality of NAND strings NS associated with bit lines BL0 to BLm (m is an integer of 1 or more), respectively. The number of bit lines BL may be 1. Each NAND string NS includes, for example, memory cell transistors MT0 to MT7 and selection transistors ST1 and ST2. Each memory cell transistor MT includes a control gate and a charge accumulation portion, and nonvolatilely holds data. Each of the selection transistors ST1 and ST2 is used to select the string unit SU in various kinds of operations.

In each NAND string NS, the memory cell transistors MT0 to MT7 are connected in series. The drain of the selection transistor ST1 is connected to the associated bit line BL. The source of the selection transistor ST1 is connected to one end of the serially connected memory cell transistors MT0 to MT7. The drain of the selection transistor ST2 is connected to the other end of the serially connected memory cell transistors MT0 to MT7. The source of the selection transistor ST2 is connected to a source line SL.

In the same block BLK, the control gates of the memory cell transistors MT0 to MT7 are connected to word lines WL0 to WL7, respectively. The gates of the selection transistors ST1 in the string units SU0 to SU4 are connected to selection gate lines SGD0 to SGD4, respectively. The gates of the plurality of selection transistors ST2 are connected to a selection gate line SGS.

Different column addresses are assigned to the bit lines BL0 to BLm. Each bit line BL is shared by the NAND strings NS to which the same column address is assigned between the plurality of blocks BLK. The word lines WL0 to WL7 are provided for each block BLK. The source line SL is shared between, for example, the plurality of blocks BLK.

A set of the plurality of memory cell transistors MT connected to the common word line WL in one string unit SU is called, for example, a cell unit CU. For example, the storage capacity of the cell unit CU including the memory cell transistors MT each of which stores 1-bit data is defined as "1 page data". The cell unit CU can have a storage capacity of 2 page data or more in accordance with the number of bits of data to be stored in the memory cell transistors MT.

Note that the circuit configuration of the memory cell array 10 provided in the memory device 3 according to the first embodiment is not limited to the above-described configuration. For example, the number of string units SU included in each block BLK can be designed to an arbitrary number. The number of memory cell transistors MT and the number of selection transistors ST1 and ST2 included in each NAND string NS can be designed to arbitrary numbers.

1.1.4 Structure of Memory Device

An example of the structure of the memory device 3 according to the first embodiment will be described below. Note that in the drawings to be referred to below, an X direction corresponds to the extending direction of the word line WL. A Y direction corresponds to the extending direction of the bit line BL. A Z direction corresponds to a vertical direction to the surface of a semiconductor substrate used to form the memory device 3. In a planar view, hatching is appropriately added to make the drawing easier to view. The hatching added to the planar view is not necessarily associated with the material or characteristic of a constituent element to which the hatching is added. In a sectional view, components are appropriately omitted to make the drawing easier to view.

1.1.4.1 Planar Layout of Memory Device

Figure 3:
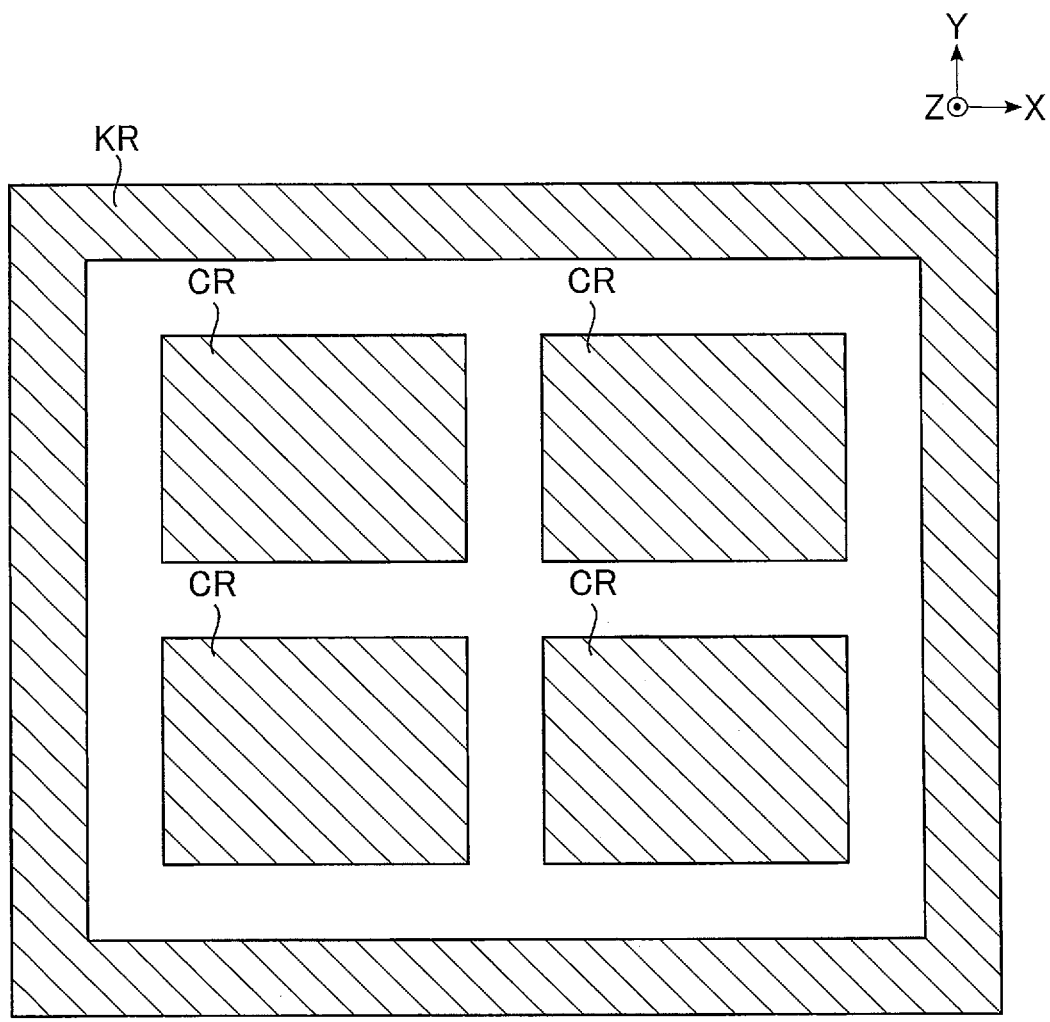
FIG. 3 is a plan view showing an example of the planar layout of the memory device according to the first embodiment.

FIG. 3 is a plan view showing an example of the planar layout of the memory device according to the first embodiment. As shown in FIG. 3, the planar layout of the memory device 3 is divided into, for example, a plurality of core regions CR and a kerf region KR.

The core regions CR are provided, for example, at the center of the semiconductor substrate. The memory cell array 10 is arranged in each core region CR. In the example shown in FIG. 3, four core regions CR are rectangularly arranged in a matrix. However, the first embodiment is not limited to this. For example, the core regions CR can be arranged in an arbitrary shape and in an arbitrary region.

The kerf region KR is a rectangular annular shape provided to surround the outer periphery of the core regions CR. The kerf region KR contacts the outermost periphery of the semiconductor substrate. The kerf region KR is provided with, for example, an alignment mark, a guard ring, and the like to be used in manufacturing of the memory device 3. The portions of structures in the kerf region KR may be removed by a dicing process of cutting a plurality of memory devices 3 formed on a wafer for each chip.

1.1.4.2 Planar Layout in Core Region

FIG. 4 is a plan view showing an example of a planar layout in the core region of the memory device according to the first embodiment. FIG. 4 shows a region of the core region CR, which corresponds to four blocks BLK0 to BLK3 included in the memory cell array 10. As shown in FIG. 4, the planar layout of the memory cell array 10 is divided into a memory region MA and hookup regions HA1 and HA2 in, for example, the X direction. In addition, the memory cell array 10 includes a plurality of members SLT and SHE.

The memory region MA is a region including the plurality of NAND strings NS. Each of the hookup regions HA1 and HA2 is a region used for connection between a stacked wiring (for example, the word lines WL0 to WL7 and the selection gate lines SGD and SGS) and the row decoder module 15. The memory region MA is arranged between the hookup region HA1 and the hookup region HA2.

The plurality of members SLT each having a plurality of portions (not shown) extending in the X direction are arranged in the Y direction. Each member SLT crosses the memory region MA and the hookup regions HA1 and HA2 in the X direction in the boundary region between the adjacent blocks BLK. Also, each member SLT has a structure with, for example, an embedded insulator or plate-shaped contact. The member SLT divides stacked wirings adjacent to each other via the member SLT.

The plurality of members SHE are extended along the X direction and arranged in the Y direction. In this example, four members SHE are arranged between adjacent members SLT. Each member SHE crosses the memory region MA in the X direction. The two ends of each member SHE are included in the hookup regions HA1 and HA2, respectively. Also, each member SHE has a structure with, for example, an embedded insulating member. Each member SHE divides the selection gate lines SGD adjacent to each other via the member SHE.

In the planar layout of the memory cell array 10 in the core region CR described above, each of regions separated by the members SLT corresponds to one block BLK. In addition, each of regions separated by the members SLT and SHE corresponds to one string unit SU. In the memory cell array 10 in the core region CR, for example, the layout shown in FIG. 4 is repetitively arranged in the Y direction.

Note that the planar layout in the core region CR of the memory device 3 according to the embodiment is not limited to the above-described layout. For example, the number of members SHE arranged between the adjacent members SLT can be designed to an arbitrary number. The number of string units SU formed between the adjacent members SLT can be changed based on the number of members SHE arranged between the adjacent members SLT.

1.1.4.3 Planar Layout in Memory Region

Figure 5:
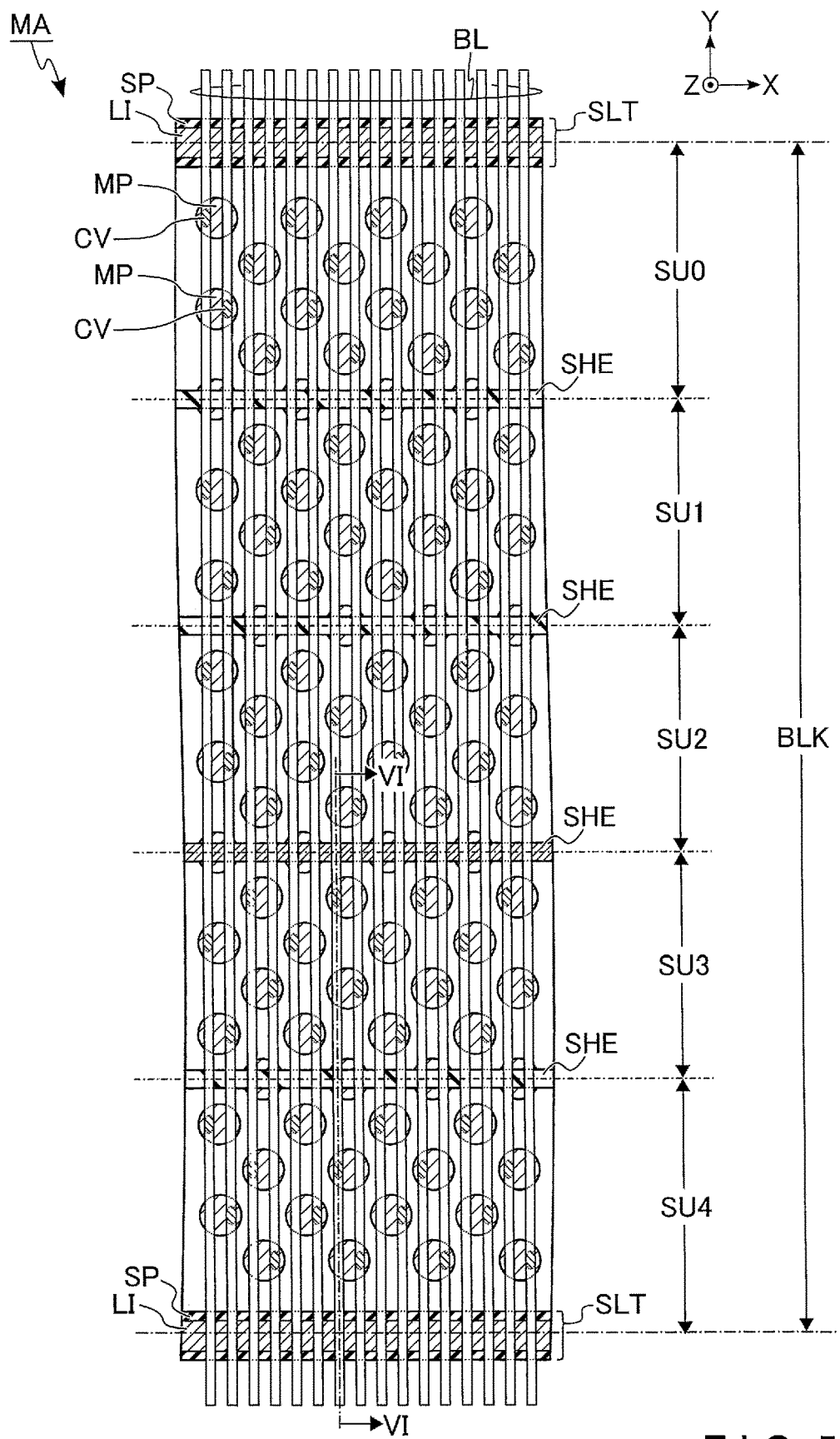
FIG. 5 is a plan view showing an example of a planar layout in the memory region of the memory device according to the first embodiment.

FIG. 5 is a plan view showing an example of a planar layout in the memory region of the memory device according to the first embodiment. FIG. 5 shows a region including one block BLK (that is, the string units SU0 to SU4), and two members SLT that sandwich the block. As shown in FIG. 5, in the memory region MA, the memory cell array 10 includes a plurality of memory pillars MP, a plurality of contacts CV, and a plurality of bit lines BL. In addition, each member SLT includes a contact LI and a spacer SP.

Each memory pillar MP functions as, for example, one NAND string NS. In the region between the two adjacent members SLT, the plurality of memory pillars MP are arranged in, for example, a staggered pattern of 24 lines. For example, one member SHE overlaps each of the fifth line of memory pillars MP, the 10th line of memory pillars MP, the 15th line of memory pillars MP, and the 20th line of memory pillars MP counted from the upper side of the drawing.

The plurality of bit lines BL are extended in the Y direction and arranged in the X direction. Each bit line BL is arranged to overlap at least one memory pillar MP in each string unit SU. In the example shown in FIG. 5, two bit lines BL are arranged to overlap one memory pillar MP. One bit line BL of the plurality of bit lines BL overlapping the memory pillars MP and one corresponding memory pillar MP are electrically connected via the contact CV.

For example, the contacts CV between the bit lines BL and the memory pillars MP in contact with the members SHE are omitted. In other words, the contacts CV between the bit lines BL and the memory pillars MP in contact with two different selection gate lines SGD are omitted. The numbers and arrangements of memory pillars MP, members SHE, and the like between the adjacent members SLT are not limited to the configuration described with reference to FIG. 5 and can appropriately be changed. The number of bit lines BL overlapping each memory pillar MP can be designed to an arbitrary number.

The contact LI is a conductor film spreading in the X-Z plane. The spacer SP is an insulator film provided on each side surface of the contact LI. In other words, the contact LI is surrounded by the spacers SP in a planar view.

1.1.4.4 Sectional Structure of Memory Region

Figure 6:
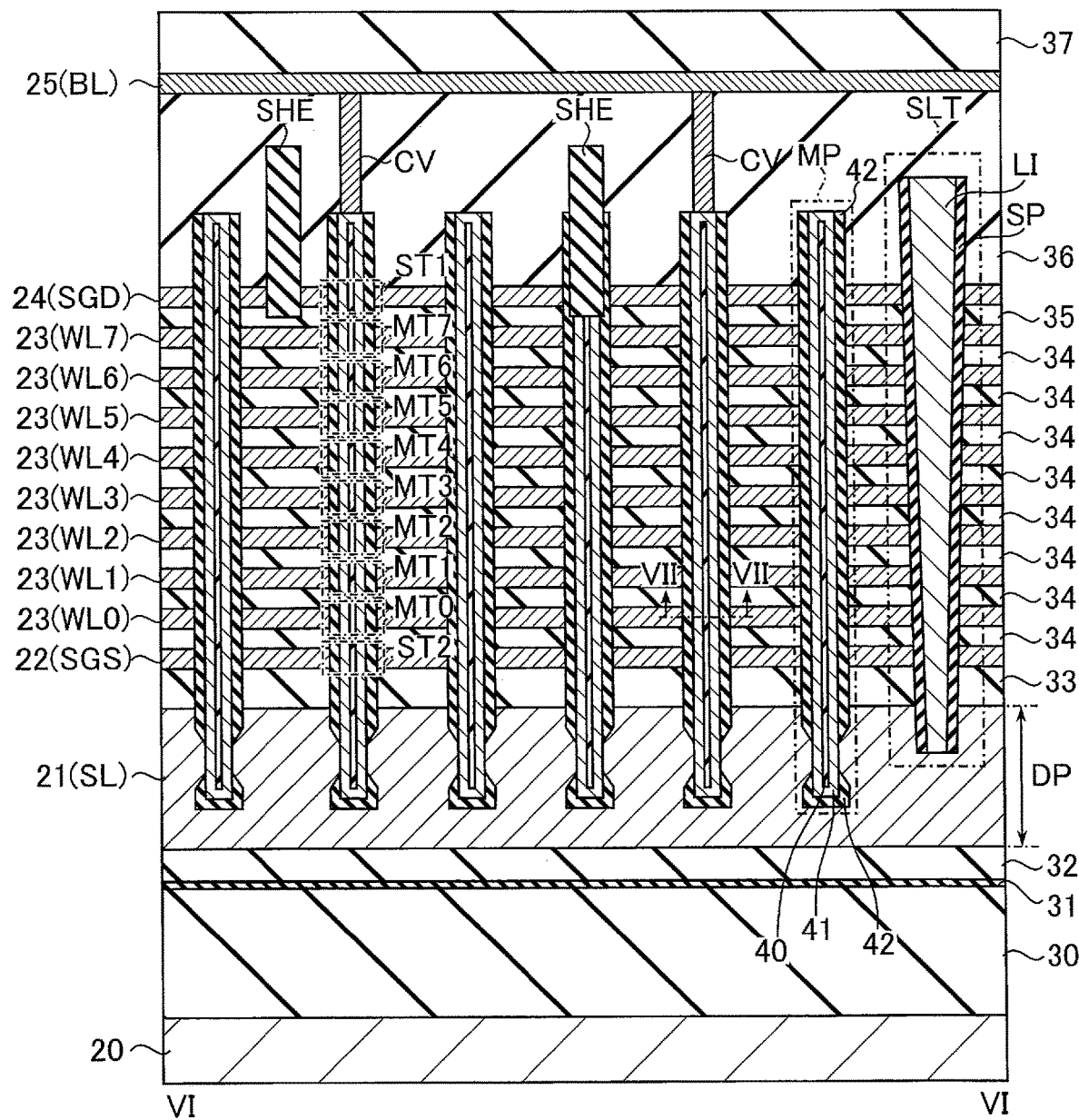
FIG. 6 is a sectional view showing an example of a sectional structure in the memory region of the memory device according to the first embodiment, which is taken along a line VI-VI in FIG. 5.

FIG. 6 is a sectional view showing an example of a sectional structure in the memory region of the memory device according to the first embodiment, which is taken along a line VI-VI in FIG. 5. As shown in FIG. 6, the memory cell array 10 further includes a semiconductor substrate 20, conductor layers 21 to 25, and insulator layers 30 to 37. The insulator layers 30 to 37 each contain, for example, silicon oxide, except the insulator layer 31.

The semiconductor substrate 20 is, for example, a p-type semiconductor. The insulator layer 30 is provided on the upper surface of the semiconductor substrate 20. The semiconductor substrate 20 and the insulator layer 30 include circuits (not shown). The circuits included in the semiconductor substrate 20 and the insulator layer 30 corresponds to the row decoder module 15, the sense amplifier module 16, and the like. The circuits included in the semiconductor substrate 20 and the insulator layer 30 include, for example, transistors (not shown). The insulator layer 31 is provided on the upper surface of the insulator layer 30.

The insulator layer 31 is a barrier film. The insulator layer 31 suppresses, for example, invasion of water from the structure above the insulator layer 31 into the transistors included in the semiconductor substrate 20 and the insulator layer 30. The insulator layer 31 contains, for example, silicon nitride. The insulator layer 32 is provided on the upper surface of the insulator layer 31.

The conductor layer 21 is provided on the insulator layer 32. The conductor layer 21 is, for example, a plate-shaped conductor spreading along the X-Y plane. The conductor layer 21 is used as the source line SL. The conductor layer 21 contains, for example, silicon doped with phosphorus. The insulator layer 33 is provided on the upper surface of the conductor layer 21.

In the following description, structures including the conductor to the height where the conductor layer 21 is provided will collectively be called a conductive portion DP. That is, the conductor layer 21 is a part of the conductive portion DP. The conductive portion DP is continuously arranged in the core regions CR and the kerf region KR, thereby contributing to suppressing of arcing caused by positive charges generated in the manufacturing process of the memory cell array 10.

The conductor layer 22 is provided on the upper surface of the insulator layer 33. The conductor layer 22 is, for example, a plate-shaped conductor spreading along the X-Y plane. The conductor layer 22 is used as the selection gate line SGS. The conductor layer 22 contains, for example, tungsten.

The insulator layers 34 and the conductor layers 23 are alternatively stacked on the upper surface of the conductor layer 22. The conductor layer 23 is, for example, a plate-shaped conductor spreading along the X-Y plane. The plurality of stacked conductor layers 23 are used as the word lines WL0 to WL7, respectively, sequentially from the side of the semiconductor substrate 20. The conductor layer 23 contains, for example, tungsten.

The insulator layer 35 is provided on the upper surface of the uppermost conductor layer 23. The conductor layer 24 is provided on the upper surface of the insulator layer 35. The conductor layer 24 is, for example, a plate-shaped conductor spreading along the X-Y plane. The conductor layer 24 is used as the selection gate line SGD. The conductor layer 24 contains, for example, tungsten.

The insulator layer 36 is provided on the upper surface of the conductor layer 24. The conductor layer 25 is provided on the upper surface of the insulator layer 36. The conductor layer 25 is, for example, a linear conductor extending in the Y direction. The conductor layer 25 is used as the bit line BL. That is, in a region (not shown), a plurality of conductor layers 25 are arrayed along the X direction. The conductor layer 25 contains, for example, copper. The insulator layer 37 is provided on the upper surface of the conductor layer 25.

The plurality of memory pillars MP are provided to extend through the insulator layers 33 to 35 and the conductor layers 22 to 24. Each memory pillar. MP extends in the Z direction. The bottom portion of each memory pillar MP reaches the conductor layer 21. A portion where the memory pillar MP and the conductor layer 22 cross functions as the selection transistor ST2. A portion where the memory pillar MP and one conductor layer 23 cross functions as one memory cell transistor MT. A portion where the memory pillar MP and the conductor layer 24 cross functions as the selection transistor ST1.

Also, each memory pillar MP includes, for example, a core film 40, a semiconductor film 41, and a stacked film 42. The core film 40 extends in the Z direction. For example, the upper end of the core film 40 is included in a layer on the upper side of the conductor layer 24. The lower end of the core film 40 reaches the conductor layer 21. The semiconductor film 41 covers the periphery of the core film 40. A part of the semiconductor film 41 contacts the conductor layer 21 via the side surface of the memory pillar MP. The stacked film 42 covers the side surface and the bottom surface of the semiconductor film 41 except a portion where the semiconductor film 41 and the conductor layer 21 are in contact. The core film 40 contains, for example, an insulator such as silicon oxide. The semiconductor film 41 contains, for example, silicon.

The columnar contact CV is provided on the upper surface of the semiconductor film 41 in the memory pillar MP. In the region shown in FIG. 6, one contact CV corresponding to one of the two memory pillars MP in each of the sectional regions partitioned by the members SLT and SHE is shown. In the memory region MA, the memory pillar MP that does not overlap the member SHE and is not connected to the contact CV in FIG. 6 is connected to the contact CV in a certain region (not shown).

One conductor layer 25, that is, one bit line BL contacts the upper surface of the contact CV. One conductor layer 25 contacts one contact CV in each of the spaces partitioned by the members SLT and SHE. That is, the memory pillar MP provided between the adjacent members SLT and SHE and the memory pillar MP provided between the two adjacent members SHE are electrically connected to each conductor layer 25.

The member SLT includes, for example, a portion provided along the X-Z plane. The member SLT divides the conductor layers 22 to 24. The upper end of the member SLT is located on the upper side of the upper end of the memory pillar MP. A part of the upper end of the contact LI in the member SLT contacts the insulator layer 36. The lower end of the contact LI contacts the conductor layer 21. The spacers SP are provided between the contact LI and the conductor layers 22 to 24. That is, the contact LI and the conductor layers 22 to 24 are separated and insulated by the spacers SP. The contact LI can be used as a part of the source line SL.

The member SHE includes, for example, a portion provided along the X-Z plane. The member SHE divides the conductor layer 25. The upper end of the member SHE is located on the upper side of the upper end of the member SLT. The upper end of the member SHE contacts the insulator layer 36. The lower end of the member SHE contacts the insulator layer 35. The member SHE contains, for example, an insulator such as silicon oxide.

Note that each of the conductor layers 22 to 24 can include an arbitrary number of layers. For example, if a plurality of conductor layers 24 are provided, the lower end of the member SHE is located between the uppermost conductor layer 23 and the lowermost conductor layer 24. That is, the length of the member SHE along the Z direction increases in accordance with the number of conductor layers 24.

Figure 7:
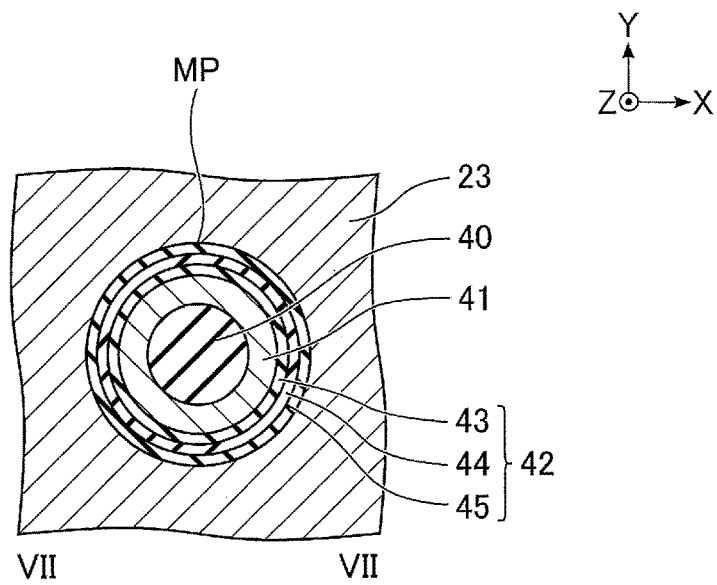
FIG. 7 is a sectional view showing an example of the sectional structure of the memory pillar of the memory device according to the first embodiment, which is taken along a line VII-VII in FIG. 6.

FIG. 7 is a sectional view showing an example of the sectional structure of the memory pillar in the memory device according to the first embodiment, which is taken along a line VII-VII in FIG. 6. More specifically, FIG. 7 shows the sectional structure of the memory pillar MP in a layer that is parallel to the surface of the semiconductor substrate 20 and includes the conductor layer 23. As shown in FIG. 7, the stacked film 42 includes, for example, a tunnel insulating film 43, a charge accumulation film 44, and a block insulating film 45.

In the cross section including the conductor layer 23, the core film 40 is provided, for example, at the center of the memory pillar MP. The semiconductor film 41 surrounds the side surface of the core film 40. The tunnel insulating film 43 surrounds the side surface of the semiconductor film 41. The charge accumulation film 44 surrounds the side surface of the tunnel insulating film 43. The block insulating film 45 surrounds the side surface of the charge accumulation film 44. The conductor layer 23 surrounds the side surface of the block insulating film 45.

The semiconductor film 41 is used as the channels (current paths) of the memory cell transistors MT0 to MT7 and the selection transistors ST1 and ST2. Each of the tunnel insulating film 43 and the block insulating film 45 contains, for example, silicon oxide. The charge accumulation film 44 has a function of accumulating charges. The charge accumulation film 44 contains, for example, silicon nitride. This allows each memory pillar MP to function as one NAND string NS.

The memory device 3 according to the first embodiment can cause a current to flow between the bit line BL and the contact LI via the memory pillar MP by turning on the memory cell transistors MT0 to MT7 and the selection transistors ST1 and ST2.

1.1.4.5 Planar Layout of Conductive Portion

Figure 8:
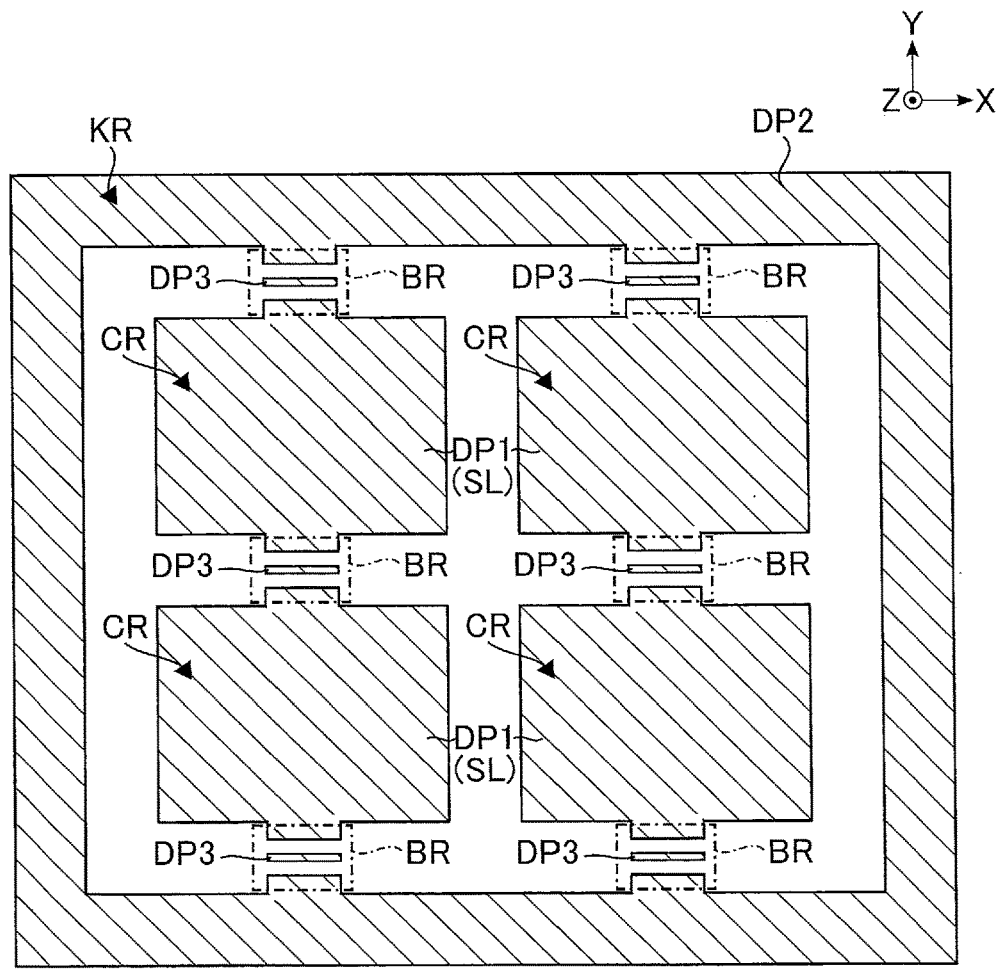
FIG. 8 is a plan view showing an example of the planar layout of the conductive portion of the memory device according to the first embodiment.

FIG. 8 is a plan view showing an example of the planar layout of the conductive portion of the memory device according to the first embodiment. In FIG. 8, components other than the conductive portion DP are omitted for the descriptive convenience. As shown in FIG. 8, the conductive portion DP includes a plurality of portions DP1, a portion DP2, and a plurality of portions DP3. The plurality of portions DP1, the portion DP2, and the plurality of portions DP3 are provided apart from each other. In the example shown in FIG. 8, the conductive portion DP includes four portions DP1 and six portions DP3.

Each portion DP1 includes a first sub-portion, a second sub-portion, and a third sub-portion. The first sub-portion is arranged in the core region CR. The second sub-portion and the third sub-portion are connected to the first sub-portion. The second sub-portion extends in the Y direction from the core region CR to the kerf region KR. The third sub-portion extends in the Y direction from the core region CR to the core region CR adjacent in the Y direction. As described above, each portion DP1 is used as the source line SL.

The portion DP2 includes a fourth sub-portion and four fifth sub-portion. The fourth sub-portion is arranged in the kerf region KR. Each fifth sub-portion is connected to the fourth sub-portion. Each fifth sub-portion extends in the Y direction from the kerf region KR to a corresponding core region CR.

Each of four portions DP3 of the six portions DP3 is arranged between the corresponding core region CR and the kerf region KR. Each of the four portions DP3 is provided apart between the second sub-portion of the corresponding portion DP1 and the fifth sub-portion of the portion DP2. Each of two portions DP3 of the six portions DP3 is arranged between two core regions CR arranged in the Y direction. Each of the two portions DP3 is provided apart between the third sub-portions of the two corresponding portions DP1.

In the following description, a region where the second sub-portion of the portion DP1, the portion DP3, and the fifth sub-portion of the portion DP2 are arranged in this order and a region where the third sub-portion of a certain portion DP1, the portion DP3, and the third sub-portion of another portion DP1 are arranged in this order will also be referred to as bridge regions BR.

1.1.4.6 Planar Layout in Bridge Region

FIG. 9 is a plan view showing an example of a planar layout in the bridge region of the memory device according to the first embodiment. In the example shown in FIG. 9, a region of the bridge region BR, where the fifth sub-portion of the portion DP2, the portion DP3, and the second sub-portion of the portion DP1 are arranged in this order in the Y direction is shown. Note that the remaining planar layout in the bridge region BR is the same as the planar layout shown in FIG. 9, and a description thereof will be omitted. As shown in FIG. 9, the memory device 3 includes a member SEP and a plurality of members BSHE.

The member SEP has a structure including a rectangular portion in which insulators and conductors are embedded in a planar view. In a planar view, the member SEP is arranged to overlap a part of the second sub-portion of the portion DP1, the portion DP3, and a part of the fifth sub-portion of the portion DP2. Also, the member SEP includes a portion provided between the portion DP3 and the second sub-portion of the portion DP1 and a portion provided between the portion DP3 and the fifth sub-portion of the portion DP2. That is, in the bridge region BR, the member SEP divides the conductive portion DP into the second sub-portion of the portion DP1, the portion DP3, and the fifth sub-portion of the portion DP2.

The plurality of members BSHE each have a structure in which, for example, an insulating member is embedded along the X-Z plane. The plurality of members BSHE are arranged in the Y direction. Each member BSHE extends along the X direction. Each member BSHE crosses the member SEP such that the two ends along the X direction are located outside the member SEP. In the example shown in FIG. 9, three members BSHE are provided. Each of the three members BSHE crosses the second sub-portion of the portion DP1, the portion DP3, and the fifth sub-portion of the portion DP2 in the X direction. The three members BSHE divide the member SEP into four portions BSLT1 to BSLT4.

The four portions BSLT1 to BSLT4 are arranged in this order from the core region CR toward the kerf region KR. Each of the four portions BSLT1 to BSLT4 includes a spacer BSP and conductor films BLI_S and BLI_D.

The spacer BSP is an insulator film that covers the outer periphery of the member SEP except the upper surface.

The conductor film BLI_D is a conductor film spreading in the X-Z plane. The conductor film BLI_D included in the portion BSLT1 crosses the second sub-portion of the portion DP1 such that the two ends along the X direction are located outside the second sub-portion of the portion DP1. The conductor film BLI_D included in the portion BSLT2 is arranged between the portion DP3 and the second sub-portion of the portion DP1 such that the two ends along the X direction are located outside the portion DP3 and the second sub-portion of the portion DP1. The conductor film BLI_D included in the portion BSLT3 is arranged between the portion DP3 and the fifth sub-portion of the portion DP2 such that the two ends along the X direction are located outside the portion DP3 and the fifth sub-portion of the portion DP2. The conductor film BLI_D included in the portion BSLT4 crosses the fifth sub-portion of the portion DP2 such that the two ends along the X direction are located outside the fifth sub-portion of the portion DP2.

The conductor film BLI_S is a conductor film provided above the corresponding conductor film BLI_D. In a planar view, the conductor film BLI_S spreads in the X-Y plane including the corresponding conductor film BLI_D. That is, in a planar view, the outer edge of the conductor film BLI_S is located outside the outer edge of the corresponding conductor film BLI_D. The conductor film BLI_S included in the portion BSLT1 and the conductor film BLI_S included in the portion BSLT2 are in contact with the member BSHE between the portions BSLT1 and BSLT2. The conductor film BLI_S included in the portion BSLT2 and the conductor film. BLI_S included in the portion BSLT3 are in contact with the member BSHE between the portions BSLT2 and BSLT3. The conductor film BLI_S included in the portion BSLT3 and the conductor film BLI_S included in the portion BSLT4 are in contact with the member BSHE between the portions BSLT3 and BSLT4.

1.1.4.7 Sectional Structure of Bridge Region

Figure 10:
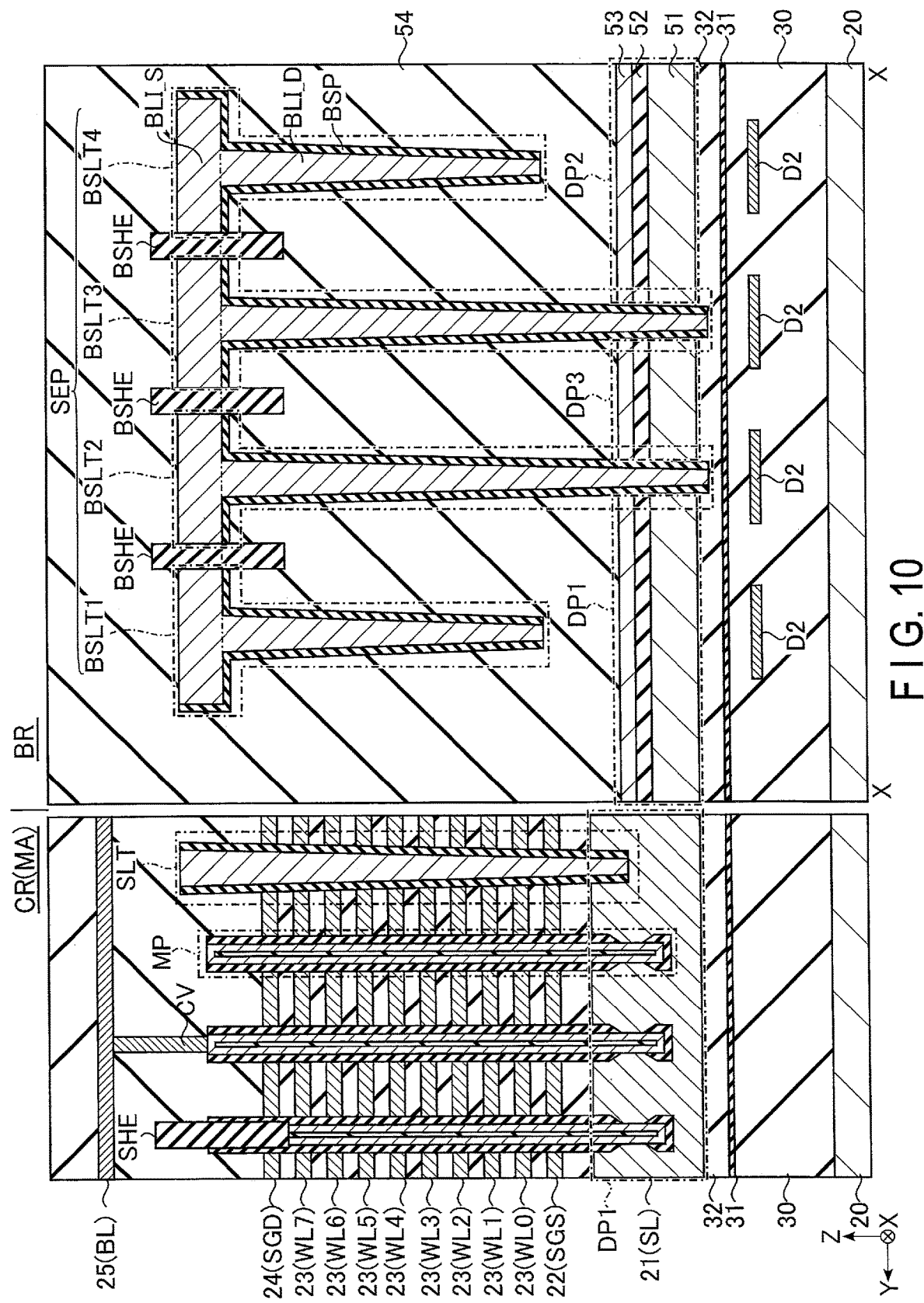
FIG. 10 shows a sectional view showing an example of a sectional structure in the bridge region of the memory device according to the first embodiment, which is taken along a line X-X in FIG. 9, and a sectional view showing an example of a sectional structure in the memory region.

FIG. 10 shows a sectional view showing an example of a sectional structure in the bridge region of the memory device according to the first embodiment, which is taken along a line X-X in FIG. 9, and a sectional view showing an example of a sectional structure in the memory region. As shown in FIG. 10, in the bridge region BR, the memory device 3 further includes a conductor layer 51, an insulator layer 52, a conductor layer 53, and an insulator layer 54. Also, in the bridge region BR, the memory device 3 further includes a plurality of conductor layers D2.

The plurality of conductor layers D2 are provided in the insulator layer 30 in the bridge region BR. The plurality of conductor layers D2 are arranged in the Y direction.

In the bridge region BR, the conductor layer 51 is provided on the upper surface of the insulator layer 32. The insulator layer 52 is provided on the conductor layer 51. The conductor layer 53 is provided on the upper surface of the insulator layer 52. The insulator layer 54 is provided on the upper surface of the conductor layer 53. The conductor layers 51 and 53 correspond to the conductive portion DP in the bridge region BR. The conductor layers 51 and 53 each contain, for example, polysilicon. The insulator layer 52 contains, for example, silicon oxide.

Each of the portions BSLT2 and BSLT3 of the member SEP divides the conductor layer 51, the insulator layer 52, and the conductor layer 53. On the other hand, each of the portions BSLT1 and BSLT4 of the member SEP does not divide the conductor layer 51, the insulator layer 52, and the conductor layer 53. Hence, each of the conductor layer 51 and 53 is divided into portions DP1, DP2, and DP3.

For example, the lower end of the conductor film BLI_D included in each of the portions BSLT2 and BSLT3 contacts the insulator layer 32. The lower end of the conductor film BLI_D included in each of the portions BSLT1 and BSLT4 contacts the insulator layer 54. In addition, the conductor film BLI_D included in each of the portions BSLT1 to BSLT4 is provided at a position where an extension to the lower side crosses the conductor layer D2.

The conductor film BLI_S is provided on the upper surface of the conductor film BLI_D included in each of the portions BSLT1 to BSLT4. The area of the lower surface of the conductor film BLI_S included in each of the portions BSLT1 to BSLT4 is larger than the area of the upper surface of the corresponding conductor film BLI_D. For this reason, the side surfaces of the conductor film BLI_S included in each of the portions BSLT1 to BSLT4 are located outside the extensions of the side surfaces of the corresponding conductor film BLI_D.

The lower end of the conductor film BLI_S included in each of the portions BSLT1 to BSLT4 is located on the upper side of the uppermost conductor layer 23. The upper end of the conductor film BLI_S included in each of the portions BSLT1 to BSLT4 is located at the same height as the upper end of the member SLT.

The spacer BSP included in the portion BSLT2 separates and insulates the conductor film BLI_D included in the portion BSLT2 from the conductor layers 51 and 53. The spacer BSP included in the portion BSLT3 separates and insulates the conductor film BLI_D included in the portion BSLT3 from the conductor layers 51 and 53.

The lower end of each member BSHE is located between the conductor layer 24 and the uppermost conductor layer 23, and located on the lower side of the conductor film BLI_S. The upper end of each member BSHE is located on the upper side of the conductor film BLI_S. The upper end of each member BSHE is located at the same height as the upper end of the member SHE.

1.2 Manufacturing Method of Memory Device

FIG. 11 is a flowchart showing an example of the manufacturing method of the memory device according to the first embodiment. Each of FIGS. 12 to 22 shows an example of the planar layout or the sectional structure halfway through the manufacturing of the memory device according to the first embodiment. The planar layout shown in the drawings represents the region corresponding to FIG. 9. The sectional structure shown in the drawings represents the region corresponding to FIG. 10. As shown in FIG. 11, in the manufacturing process of the memory device 3 according to the first embodiment, processes of steps S101 to S108 are sequentially executed. An example of a series of manufacturing processes from formation to the conductive portion DP to formation of the portions BSLT1 to BSLT4 of the member SEP and the members BSHE will be described below appropriately with reference to FIG. 11.

First, before the processing shown in FIG. 11 is executed, a circuit (not shown) including transistors is formed on a semiconductor substrate 20. A plurality of conductor layers D2 are formed on the upper side of the circuit. The plurality of conductor layers D2 are arranged immediately under regions where conductor films BLI_D included in portions BSLT1 to BSLT4 of a member SEP are scheduled to be formed in a bridge region BR. The plurality of conductor layers D2 are, for example, electrically insulated from the circuit on the semiconductor substrate 20. The circuit and the plurality of conductor layers D2 are covered with an insulator layer 30. Insulator layers 31 and 32 are formed in this order on the upper surface of the insulator layer 30.

Figure 12:
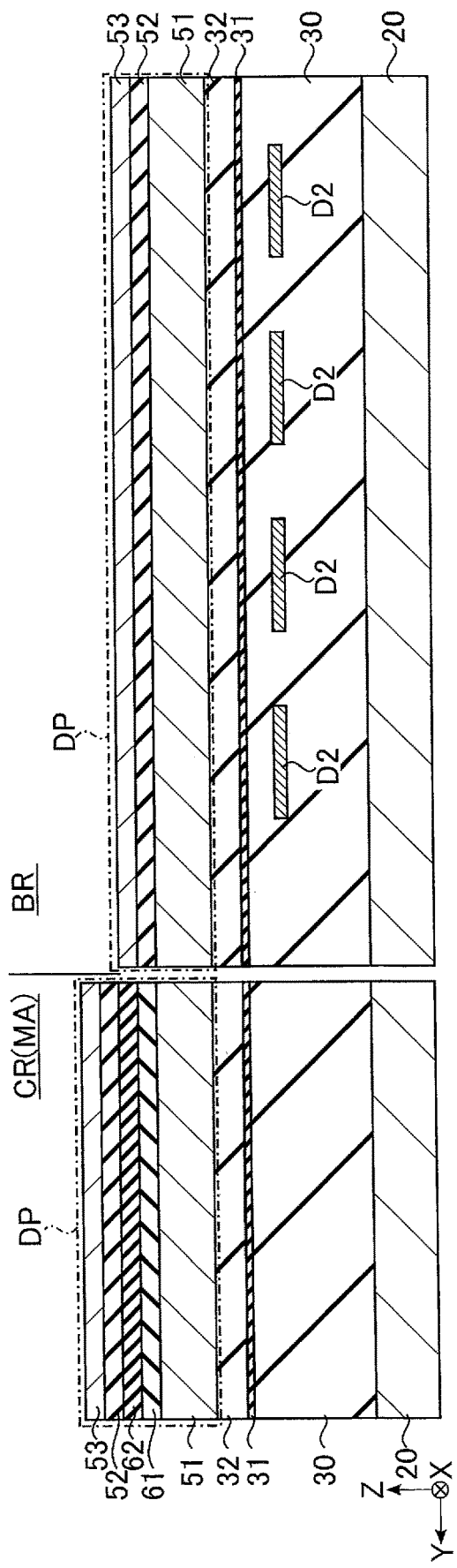
FIG. 12 is a sectional view showing an example of the sectional structure halfway through the manufacturing of the memory device according to the first embodiment.

Next, as shown in FIG. 12, a conductive portion DP is formed over a core region CR, the bridge region BR, and a kerf region KR (not shown) (step S101). To put it briefly, a conductor layer 51, an insulator layer 61, and a sacrificial member 62 are formed in this order on the upper surface of the insulator layer 32. The insulator layer 61 contains, for example, silicon oxide. The sacrificial member 62 contains, for example, amorphous silicon. Then, the insulator layer 61 and the sacrificial member 62 provided outside the core region CR are removed. After that, an insulator layer 52 and a conductor layer 53 are formed in this order. The set of the conductor layer 51, the insulator layer 61, the sacrificial member 62, the insulator layer 52, and the conductor layer 53 corresponds to the conductive portion DP.

Figure 13:
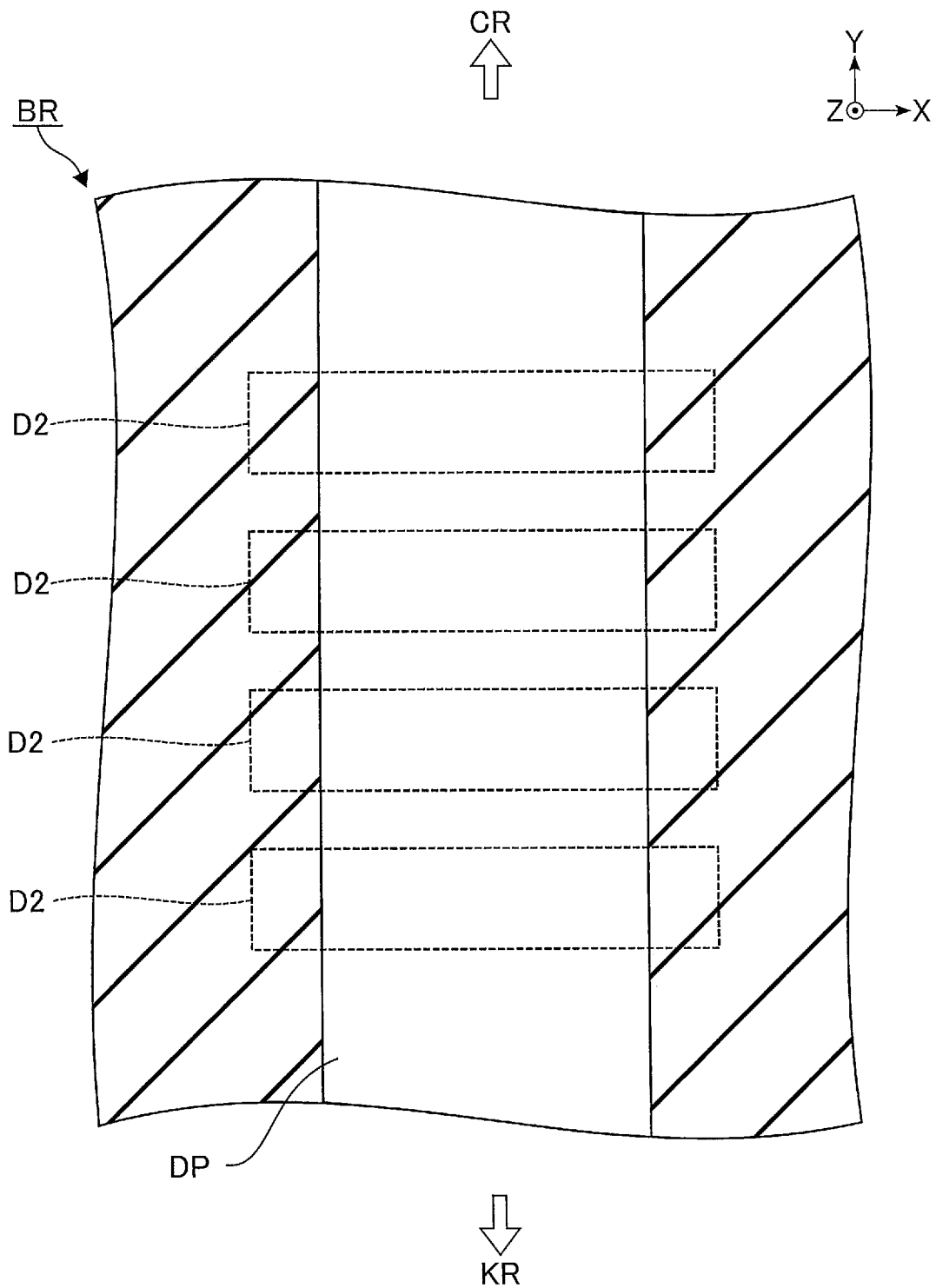
FIG. 13 is a plan view showing an example of the planar layout halfway through the manufacturing of the memory device according to the first embodiment.

Note that as shown in FIG. 13, in a planar view, the conductive portion DP formed in the bridge region BR crosses the plurality of conductor layers D2. The two ends of each of the plurality of conductor layers D2 along the X direction are located outside the conductive portion DP.

Figure 14:
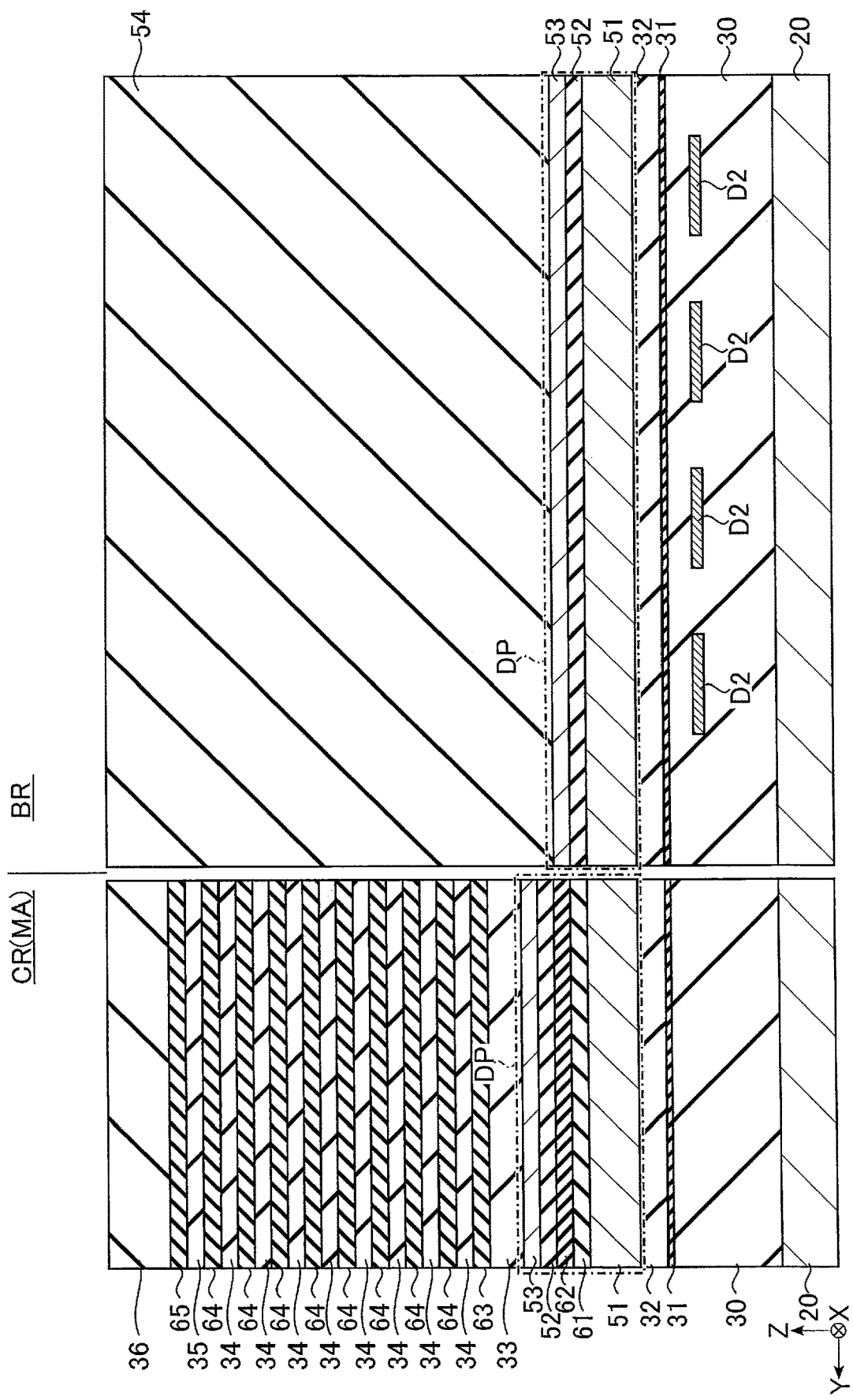
FIG. 14 is a sectional view showing an example of the sectional structure halfway through the manufacturing of the memory device according to the first embodiment.

Next, as shown in FIG. 14, in the core region CR, a stacked layer structure including sacrificial members 63, 64, and 65 is formed on the upper surface of the conductor layer 53 (step S102).

To put it briefly, an insulator layer 33 and the sacrificial member 63 are sequentially formed on the upper surface of the conductor layer 53 corresponding to the portion of the core region CR. Insulator layers 34 and the sacrificial members 64 are alternately formed on the sacrificial member 63. An insulator layer 35 and the sacrificial member 65 are sequentially formed on the uppermost sacrificial member 64. An insulator layer 36 is formed on the sacrificial member 65. The stacked layer structure is thus formed. The sacrificial members 63, 64, and 65 contain, for example, silicon nitride. Also, an insulator layer 54 is formed on the upper surface of the conductor layer 53 corresponding to the portion outside the core region CR. The upper surfaces of the stacked layer structure and the insulator layer 54 are planarized by, for example, CMP (Chemical Mechanical Polishing).

Figure 15:
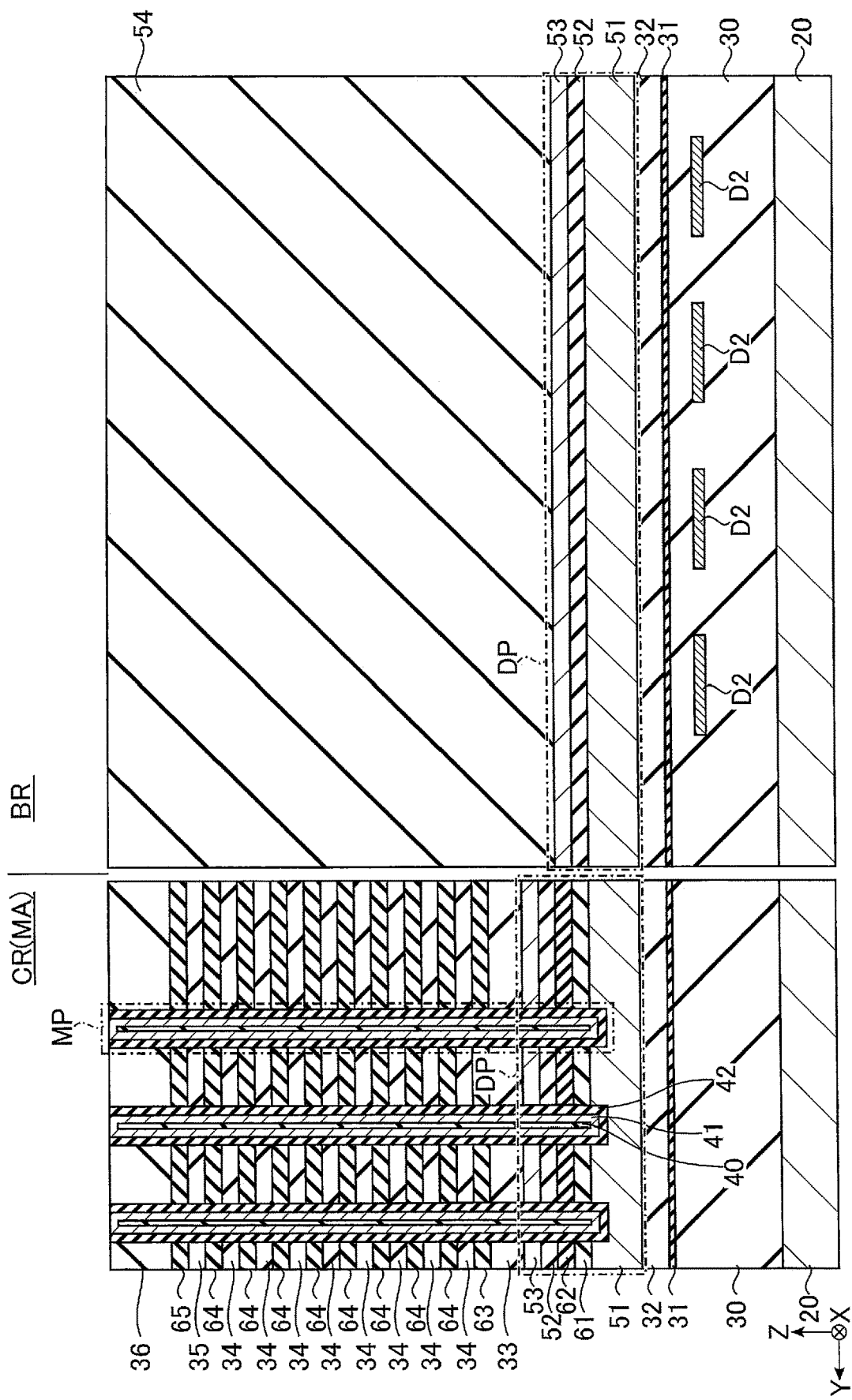
FIG. 15 is a sectional view showing an example of the sectional structure halfway through the manufacturing of the memory device according to the first embodiment.

Next, as shown in FIG. 15, a plurality of memory pillars MP are formed in the core region CR (step S103). To put it briefly, in the core region CR, a mask having openings in regions corresponding to the memory pillars MP is formed by photolithography or the like. For example, holes (not shown) extending through the conductor layer 53, the insulator layers 61, 52, 33, 34, 35, and 36, and the sacrificial members 62, 63, 64, and 65 are formed by anisotropic etching using the mask. A part of the conductor layer 51 is exposed in the bottom portion of each hole. After that, a block insulating film 45, a charge accumulation film 44, a tunnel insulating film 43, a semiconductor film 41, and a core film 40 are sequentially formed on the side surface and the bottom surface of each hole. Accordingly, a structure corresponding to the memory pillar MP is formed in each hole. As the anisotropic etching in this process, for example, RIE (Reactive Ion Etching) is used.

Figure 16:
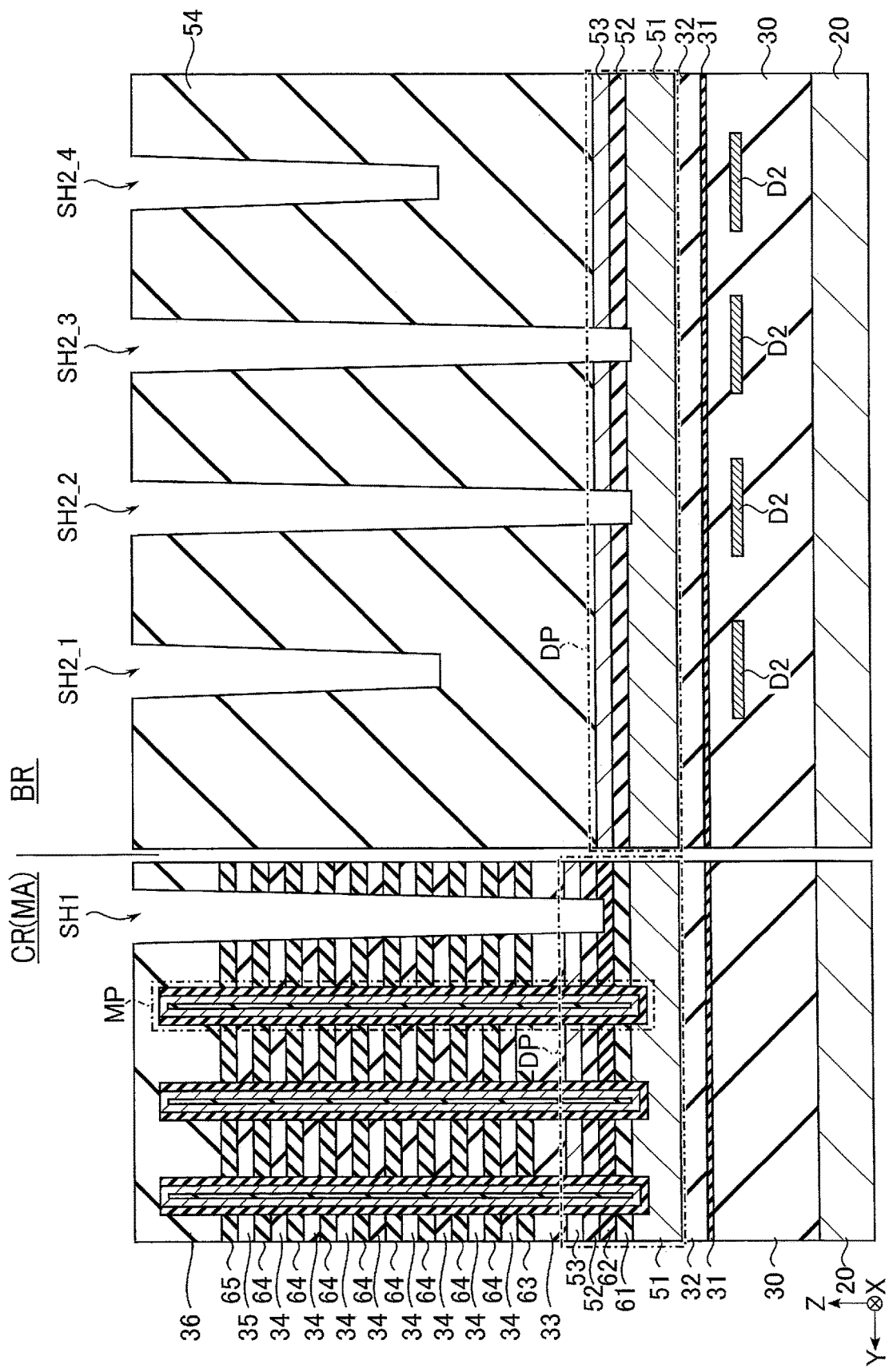
FIG. 16 is a sectional view showing an example of the sectional structure halfway through the manufacturing of the memory device according to the first embodiment.

Next, as shown in FIG. 16, a plurality of slits SH1 and SH2 are formed (step S104). The plurality of slits SH2 include four slits SH2_1, SH2_2, SH2_3, and SH2_4. More specifically, a mask having openings in regions corresponding to a plurality of members SLT and in regions corresponding to the lower portions of portions BSLT1 to BSLT4 of a member SEP is formed by photolithography or the like. Then, by anisotropic etching using the mask, the plurality of slits SH1 are formed in the core region CR, and the four slits SH2_1, SH2_2, SH2_3, and SH2_4 are formed in the bridge region BR. Each slit SH1 extends through the conductor layer 53, the insulator layers 52, 33, 34, 35, and 36, and the sacrificial members 63, 64, and 65. The four slits SH2_1, SH2_2, SH2_3, and SH2_4 are arranged in this order from the core region CR toward the kerf region KR. The slits SH2_2 and SH2_3 extend through the insulator layers 52 and 54 and the conductor layer 53. The slits SH2_1 and SH2_4 need not extend through the insulator layers 52 and 54 and the conductor layer 53. In the example shown in FIG. 16, the conductor layer 51 is exposed in the bottom portion of each of the slits SH2_2 and SH2_3. Also, the insulator layer 54 is exposed in the bottom portion of each of the slits SH2_1 and SH2_4. As the anisotropic etching in this process, for example, RIE is used.

Figure 17:
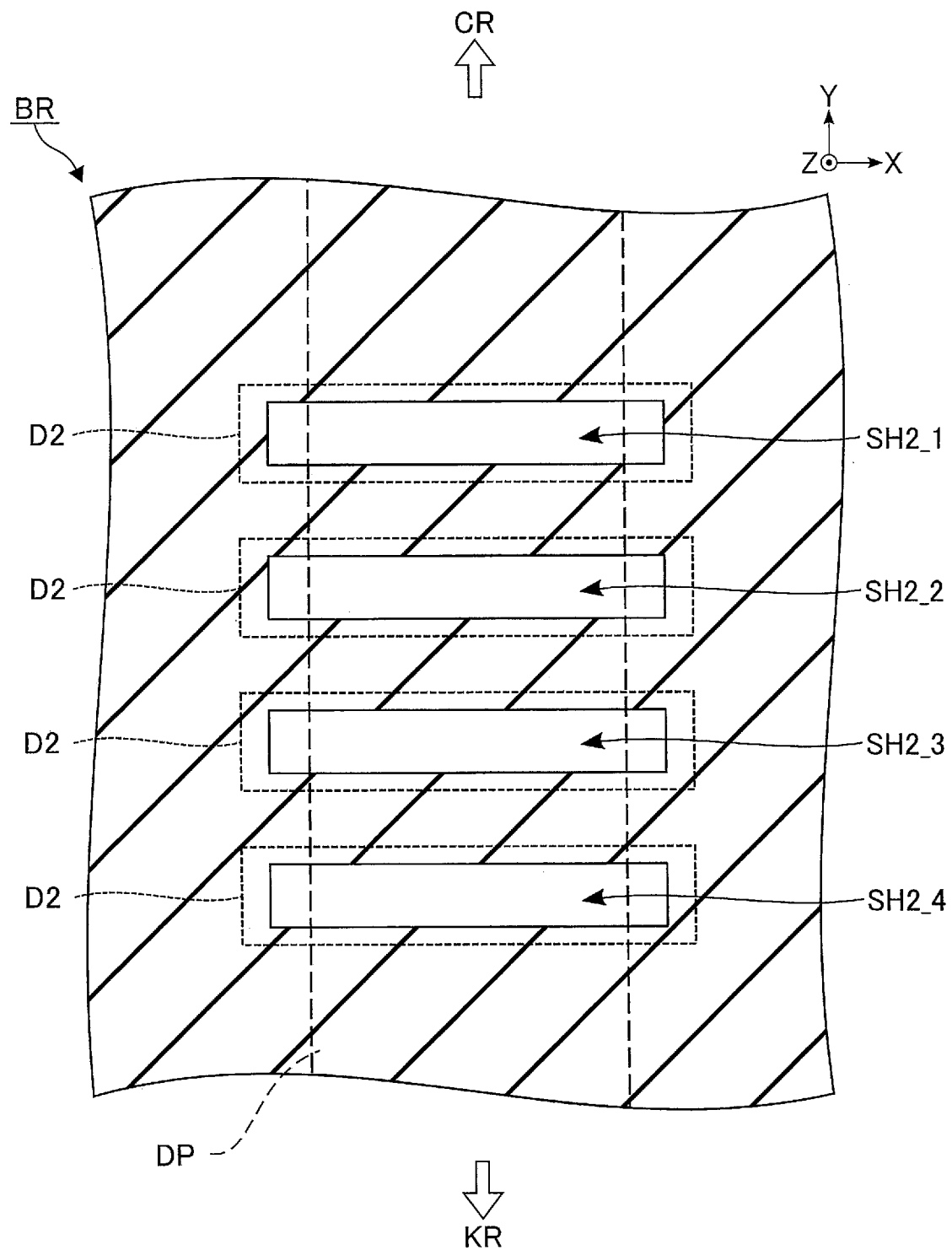
FIG. 17 is a plan view showing an example of the planar layout halfway through the manufacturing of the memory device according to the first embodiment.

Note that, as shown in FIG. 17, in a planar view, each of the slits SH2_1 to SH2_4 crosses the conductive portion DP. The two ends of each of the slits SH2_1 to SH2_4 along the X direction are located outside the conductive portion DP. In addition, each of the slits SH2_1 to SH2_4 is located inside the region where the corresponding conductor layer D2 is provided. Hence, the conductor layer D2 functions as a stop film in another anisotropic etching to be described later. This suppresses reaching of the slits SH2_1 to SH2_4 to the lower side of the conductor layers D2 by another anisotropic etching to be described later.

Figure 18:
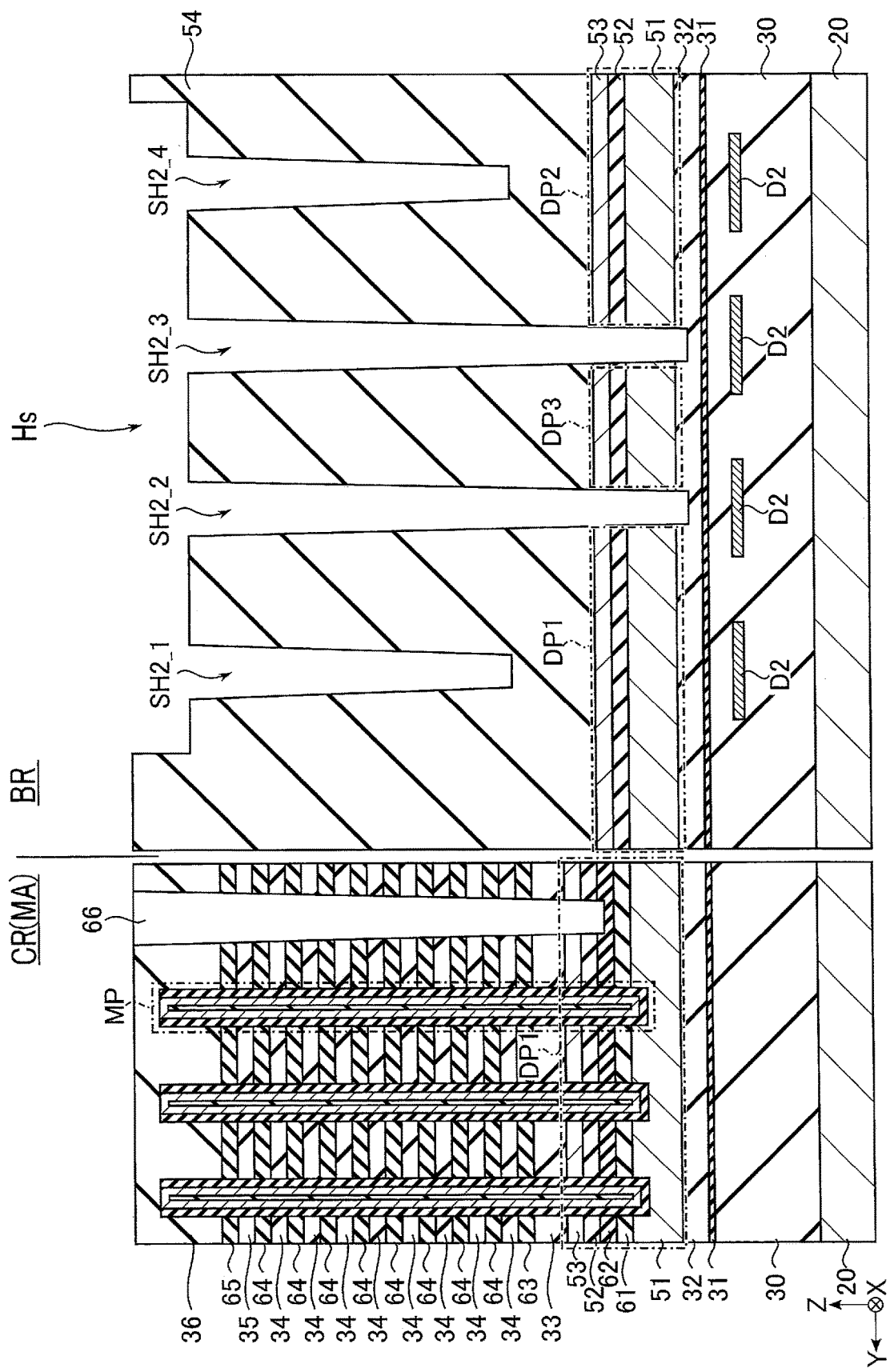
FIG. 18 is a sectional view showing an example of the sectional structure halfway through the manufacturing of the memory device according to the first embodiment.

Next, as shown in FIGS. 18 and 19, the conductive portion DP is separated into portions DP1, DP2, and DP3 (step S105). More specifically, after a sacrificial member 66 is embedded in each slit SH1, a mask having an opening in a region corresponding to the member SEP is formed by photolithography or the like. The region corresponding to the member SEP includes the regions where the four slits SH2_1, SH2_2, SH2_3, and SH2_4 are formed. By anisotropic etching using the mask, a hole Hs is formed, and the four slits SH2_1, SH2_2, SH2_3, and SH2_4 are made deeper. The hole Hs connects the four slits SH2_1, SH2_2, SH2_3, and SH2_4 on the lower side of the upper end of the insulator layer 54. The etching rate of anisotropic etching and the ease of deposit formation on the side walls are adjusted, thereby controlling such that the bottom portion of the hole Hs is located on the upper side of the uppermost sacrificial member 64. The slits SH2_2 and SH2_3 extend through the conductor layer 51. The slits SH2_1 and SH2_4 need not necessarily extend through the insulator layers 52 and 54, and the conductor layers 51 and 53. As the anisotropic etching in this process, for example, RIE is used. Accordingly, in the bridge region BR, the conductive portion DP is separated into the portions DP1, DP2, and DP3 by the slits SH2_2 and SH2_3.

Figure 20:
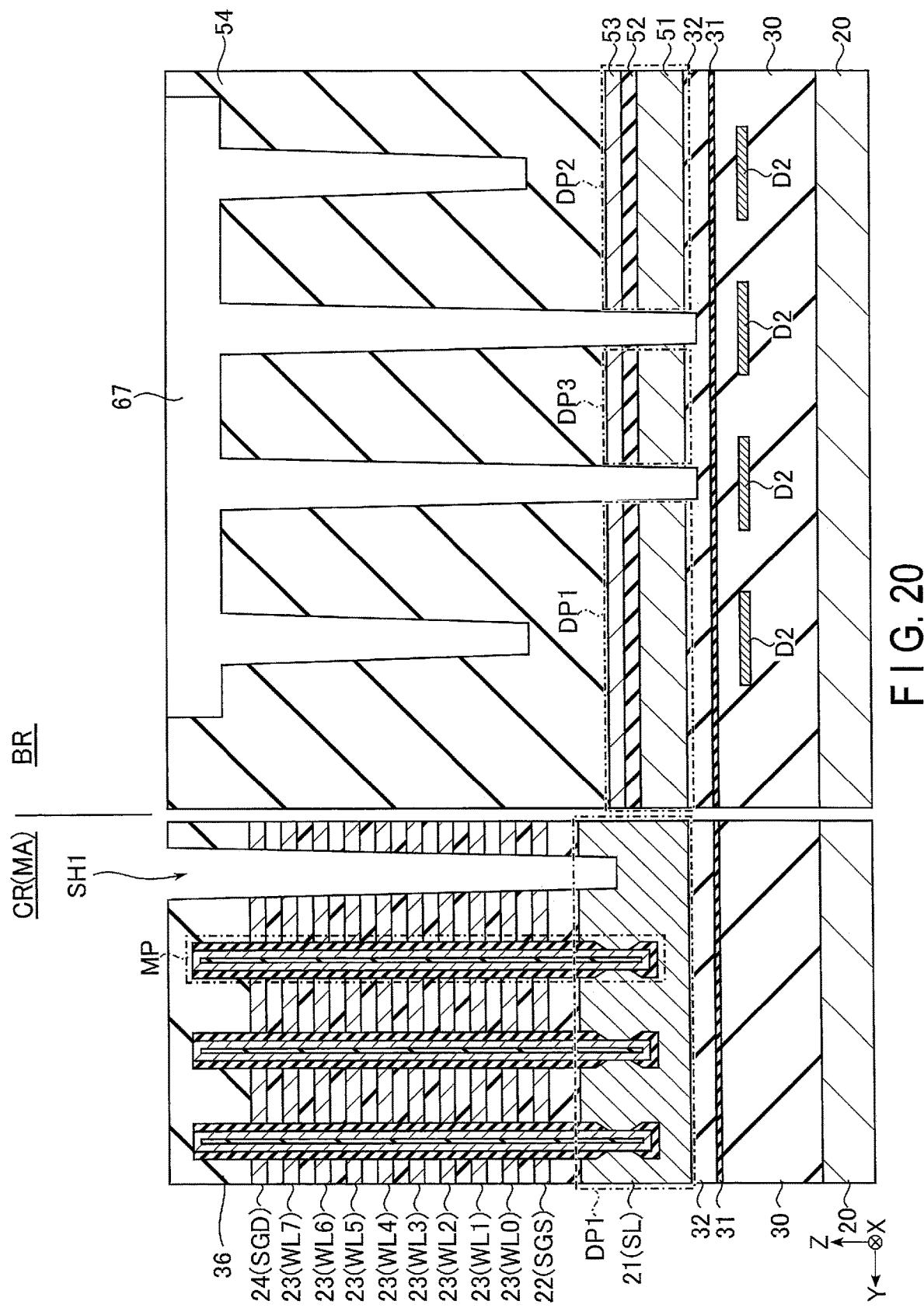
FIG. 20 is a sectional view showing an example of the sectional structure halfway through the manufacturing of the memory device according to the first embodiment.

Next, as shown in FIG. 20, replacement processing is executed (step S106). In the replacement processing, replacement processing of the portion DP1 of the conductive portion DP and replacement processing of the stacked layer structure are sequentially executed. More specifically, a sacrificial member 67 is embedded in the hole Hs and the slits SH2_1 to SH2_4. Then, the sacrificial member 66 is removed, thereby forming the slits SH1 again.

In the replacement processing of the portion DP1 of the conductive portion DP, the sacrificial member 62 is selectively removed via the slits SH1 by, for example, wet etching. Next, the insulator layers 52 and 61 in the core region CR and a part of the stacked film 42 on the side surface of each memory pillar MP are selectively removed via the slit SH1. A conductor (for example, silicon) different from the conductor layers 51 and 53 is embedded in the space formed in the portion DP1 of the conductive portion DP. A conductor layer 21 functioning as a source line SL is formed by the conductor and the conductor layers 51 and 53. The conductor layer 21 contacts the side surface of the semiconductor film 41 in the memory pillar MP and is thus electrically connected to the semiconductor film 41.

In the replacement processing of the stacked layer structure, by wet etching using hot phosphoric acid or the like, the sacrificial members 63, 64, and 65 are selectively removed via the slits SH1. A conductor is embedded, via the slits SH1, in the spaces formed by removing the sacrificial members 63, 64, and 65. To form the conductor in this process, for example, CVD (Chemical Vapor Deposition) is used. After that, the conductor formed in the slits SH1 is removed by etch-back processing. Accordingly, the conductor formed in the slits SH1 is separated into a plurality of conductor layers. Accordingly, a conductor layer 22 functioning as a selection gate line SGS, a plurality of conductor layers 23 each functioning as a word line WL, and a conductor layer 24 functioning as a selection gate line SGD are formed. The conductor layers 22, 23, and 24 formed in this process may include a barrier metal. In this case, in the conductor formation after the removal of the sacrificial members 63, 64, and 65, for example, after a titanium nitride film is formed as a barrier metal, a tungsten film is formed.

Figure 21:
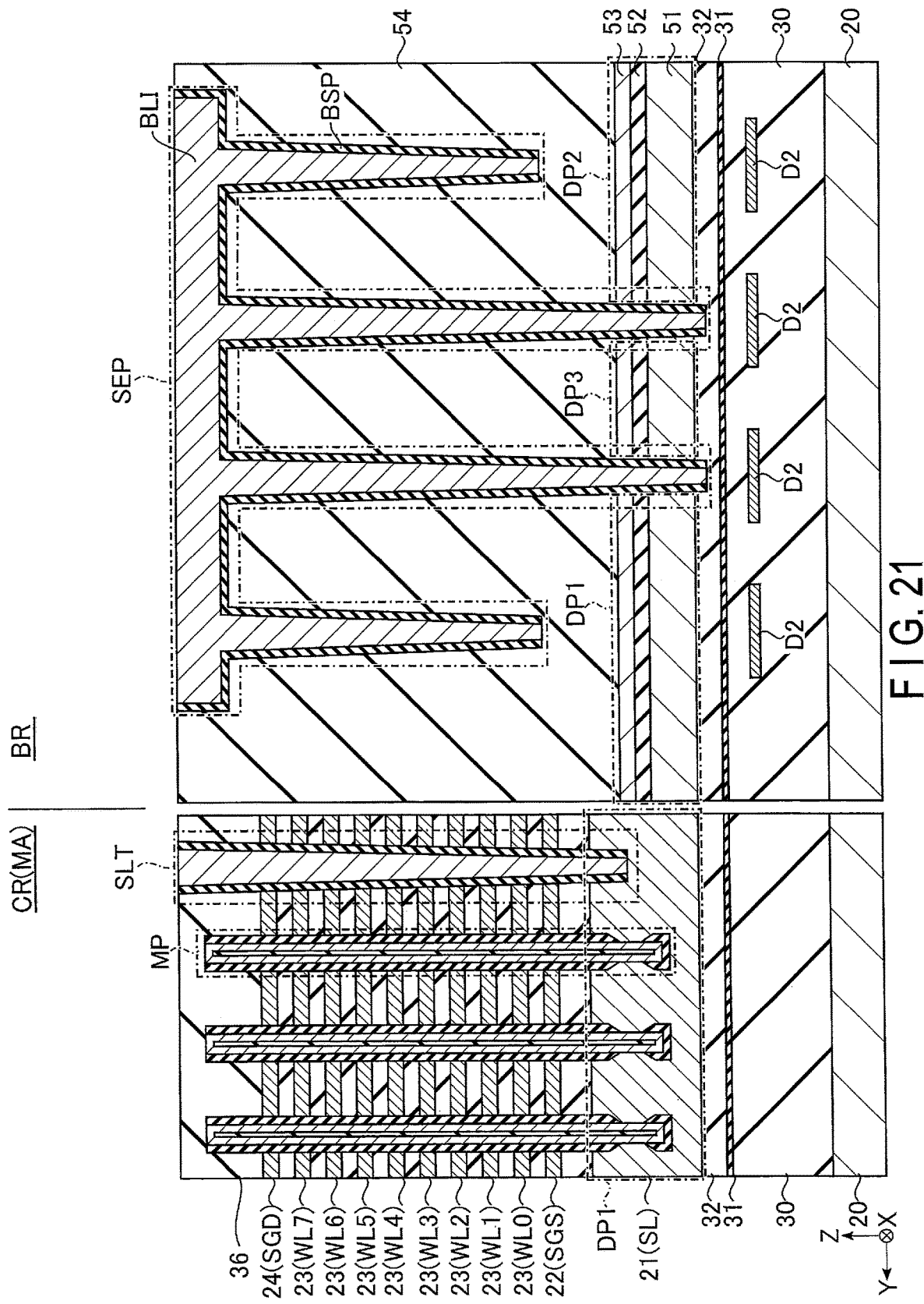
FIG. 21 is a sectional view showing an example of the sectional structure halfway through the manufacturing of the memory device according to the first embodiment.

Next, as shown in FIG. 21, the member SLT is formed in each slit SH1, and the member SEP is formed in the hole Hs and the slits SH2_1 to SH2_4 (step S107). More specifically, first, the sacrificial member 67 is removed, thereby forming the hole Hs and the slits SH2_1 to SH2_4 again. Next, after an insulating member is formed on the entire surface, a part of the insulating member provided on the bottom portion of each of the slits SH1 and SH2_1 to SH2_4 is removed. A part of the conductor layer 21 is thus exposed to the bottom portion of each slit SH1. In addition, a part of each of the insulator layers 32 and 54 is exposed to the bottom portion of each of the slits SH2_1 to SH2_4. Then, a conductive member is formed on the entire surface. The conductive member is thus electrically connected to the conductor layer 21. On the other hand, the conductive member is separated and insulated by the insulating member from the conductor layers 22 to 24, 51, and 53. After that, the insulating member and the conductive member formed outside the slits SH1, the hole Hs, and the slits SH2_1 to SH2_4 are removed by, for example, CMP. Accordingly, the insulating member is separated into spacers SP and BSP, and the conductive member is separated into contacts LI and conductor films BLI.

Next, as shown in FIG. 22, members SHE and BSHE are formed (step S108). More specifically, first, a mask having openings in regions corresponding to the plurality of members SHE and BSHE is formed by photolithography or the like. Then, by anisotropic etching using the mask, a slit corresponding to each of the plurality of members SHE is formed in the core region CR, and a slit corresponding to each of the three members BSHE is formed in the bridge region BR. Each slit in the core region CR extends through the insulator layer 36 and the conductor layer 24. Each slit in the bridge region BR extends through a portion of the conductor film BLI in the member SEP, which is formed in the hole Hs. As the anisotropic etching in this process, for example, RIE is used. Accordingly, the member SEP is separated into four portions BSLT1 to BSLT4. Then, an insulating member is formed on the entire surface. After that, the insulating member formed outside the slits is removed by, for example, CMP. Hence, the insulating member is separated into the plurality of members SHE and the three members BSHE.

By the above-described manufacturing process, the structure from the conductive portion DP to the portions BSLT1 to BSLT4 of the member SEP and the members BSHE is formed. Note that the above-described manufacturing process is merely an example, and the first embodiment is not limited to this. For example, another processing may be inserted between the manufacturing processes, and some processes may be omitted or integrated. Also, the order of the manufacturing processes may be changed as much as possible.

1.3 Effect According to First Embodiment

According to the first embodiment, it is possible to improve the yield of the memory device 3. This effect will be described below.

The member SEP is divided into the portions BSLT1 to BSLT4 by the three members BSHE. Before the division, the conductive portion DP is used to suppress arcing in the manufacturing process of the memory device 3 and then divided into the portions DP1, DP2, and DP3 by the portions BSLT2 and BSLT3 of the member SEP. Hence, the source line SL (portion DP1) is protected with respect to the portion DP2 by a withstand voltage corresponding to the sum of the film thicknesses of the spacer BSP in the portion BSLT2, the member BSHE, and the spacer BSP in the portion BSLT3. For this reason, when the memory device 3 operates, a failure caused by the insufficient withstand voltage of the source line SL with respect to the portion DP2 can be suppressed.

Supplementarily explaining, the slits SH2_1 to SH2_4 are formed by two times of anisotropic etching. In the anisotropic etching of the first time, the slits SH2_1 to SH2_4 are formed by the same process as the formation of the slits SH1 to such an extent that the conductor layer 51 is not divided. In the anisotropic etching of the second time, the conductor layer 51 is divided. Here, in the anisotropic etching of the second time, it is difficult to form a resist film between the slits SH2_1 to SH2_4. Hence, in the anisotropic etching of the second time, a mask with an opening in the region including the slits SH2_1 to SH2_4 in a planar view is formed. Hence, the hole Hs that connects the slits SH2_1 to SH2_4 is formed.

The slits SH1, the hole Hs, and the slits SH2_1 to SH2_4 are filled by the same process. Hence, the conductor film BLI that is a continuous film is formed in the hole Hs and the slits SH2_1 to SH2_4. For this reason, if the members BSHE are not formed, the portions of the conductor films BLI formed in all the slits SH2_1 to SH2_4 are electrically connected via the portion of the conductor film BLI formed in the hole Hs. In this case, the source line SL is undesirably protected with respect to the portion DP2 only by a withstand voltage corresponding to twice of the film thickness of the spacer BSP, independently of the number of slits SH2_1 to SH2_4.

According to the first embodiment, the members BSHE separate and insulate the conductor film BLI into the conductor films BLI_S and BLI_D included in the portions BSLT1 to BSLT4. This can improve the withstand voltage of the source line SL with respect to the portion DP2 by a value corresponding to the film thickness of the members BSHE. It is therefore possible to improve the yield of the memory device 3.

Note that the accuracy of the etching depth may be lower in line patterns at two ends in a plurality of line patterns arranged in a given direction than in line patterns at the center. According to the first embodiment, the four slits SH2_1 to SH2_4 arranged in the Y direction are formed. This can suppress lowering of the accuracy of the etching depth in the slits SH2_2 and SH2_3 located at the center of the four slits SH2_1 to SH2_4. For this reason, division of the conductive portion DP by the at least two slits SH2_2 and SH2_3 is guaranteed.

In addition, the conductor layers D2 are formed immediately under the four slits SH2_1 to SH2_4. Each conductor layer D2 can function as a stop film against excessive etching in the formation of the four slits SH2_1 to SH2_4. For this reason, even if unintended excessive etching occurs, damage to the circuit formed under the conductor layers D2 can be avoided.

Also, the members BSHE are formed by the same process as the members SHE. This can suppress an increase in the number of manufacturing processes in forming the members BSHE. It is therefore possible to reduce the burden in the manufacturing process.

1.4 Modification

Note that in the above-described first embodiment, a case in which the conductor films BLI_D in the portions BSLT1 and BSLT4 are not in contact with the portions DP1 and DP2, respectively, has been described. However, the first embodiment is not limited to this. The conductor films BLI_D in the portions BSLT1 and BSLT4 may be in contact with the portions DP1 and DP2, respectively. In the following explanation, a configuration and a manufacturing method different from the first embodiment will mainly be described. A description of the same configuration and manufacturing method as in the first embodiment will appropriately be omitted.

Figure 23:
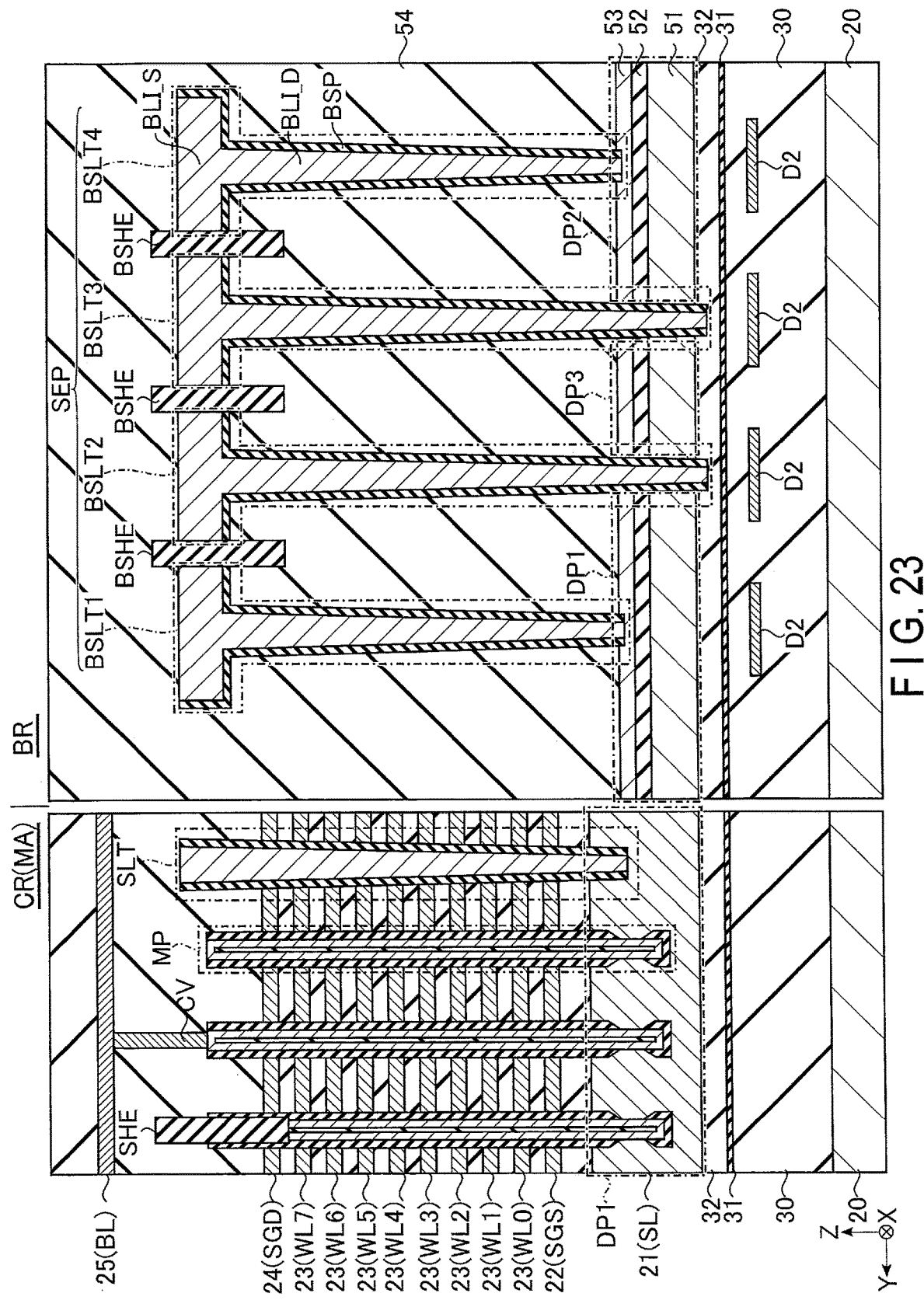
FIG. 23 is a sectional view showing an example of a sectional structure in the bridge region and the memory region of a memory device according to a modification of the first embodiment.

FIG. 23 is a sectional view showing an example of a sectional structure in the bridge region and the memory region of a memory device according to a modification of the first embodiment. FIG. 23 corresponds to FIG. 10 in the first embodiment.

As shown in FIG. 23, the lower end of the conductor film BLI_D included in each of the portions BSLT1 and BSLT4 may be in contact with the conductor layer 53. The configuration is not limited to the example shown in FIG. 23, and the lower end of the conductor film BLI_D included in each of the portions BSLT1 and BSLT4 may be in contact with the conductor layer 51.

If the portions BSLT1 and BSLT4 contact the conductor layers 51 and 53 and are thus electrically connected to the portions DP1 and DP2, respectively, the spacers BSP in the portions BSLT1 and BSLT4 cannot contribute to the withstand voltage of the source line SL with respect to the portion DP2. However, according to the modification of the first embodiment, the member SEP is divided into the four portions BSLT1 to BSLT4 by the three members BSHE. Hence, the source line SL is protected by a withstand voltage corresponding to a thinner one of the sum of the twice of the film thickness of the spacer BSP and the film thickness of the member BSHE and three times of the film thickness of the member BSHE with respect to the portion DP2. Hence, irrespective of whether the portion BSLT1 and the portion DP1, and the portion BSLT4 and the portion DP2 are electrically connected or not, the withstand voltage of the source line SL with respect to the portion DP2 can be ensured.

2. Second Embodiment

A memory device 3 according to the second embodiment will be described next. The memory device 3 according to the second embodiment is different from the memory device 3 according to the first embodiment in that a plurality of members BSHE are provided between two portions BSLT. In the following explanation, a description of the same configuration and manufacturing method as in the first embodiment will be omitted, and a configuration and manufacturing method different from the first embodiment will mainly be described.

2.1 Planar Layout in Bridge Region

FIG. 24 is a plan view showing an example of a planar layout in the bridge region of the memory device according to the second embodiment. FIG. 24 corresponds to FIG. 9 in the first embodiment.

As shown in FIG. 24, in the second embodiment, six members BSHE are provided. Two of the six members BSHE cross the second sub-portion of a portion DP1 in the X direction. Two of the remaining four members BSHE cross a portion DP3. The remaining two members BSHE cross the fifth sub-portion of a portion DP2. Each member BSHE crosses a member SEP such that the two ends along the X direction are located outside the member SEP. The members BSHE divide the member SEP into seven portions BSLT1 to BSLT7.

The seven portions BSLT1, BSLT5, BSLT2, BSLT6, BSLT3, BSLT7, and BSLT4 are arranged in this order from a core region CR toward a kerf region KR. The configurations of the four portions BSLT1 to BSLT4 are the same as in the first embodiment, and a description thereof will be omitted. Each of the three portions BSLT5 to BSLT7 includes a spacer BSP and a conductor film BLI_S.

The portion BSLT5 is located between the two members BSHE provided on the upper side of the second sub-portion of the portion DP1. The conductor film BLI_S included in the portion BSLT5 is in contact with each of the two members BSHE sandwiching the portion BSLT5.

The portion BSLT6 is located between the two members BSHE provided on the upper side of the portion DP3. The conductor film BLI_S included in the portion BSLT6 is in contact with each of the two members BSHE sandwiching the portion BSLT6.

The portion BSLT7 is located between the two members BSHE provided on the upper side of the fifth sub-portion of the portion DP2. The conductor film BLI_S included in the portion BSLT7 is in contact with each of the two members BSHE sandwiching the portion BSLT7.

2.2 Sectional Structure of Bridge Region

Figure 25:
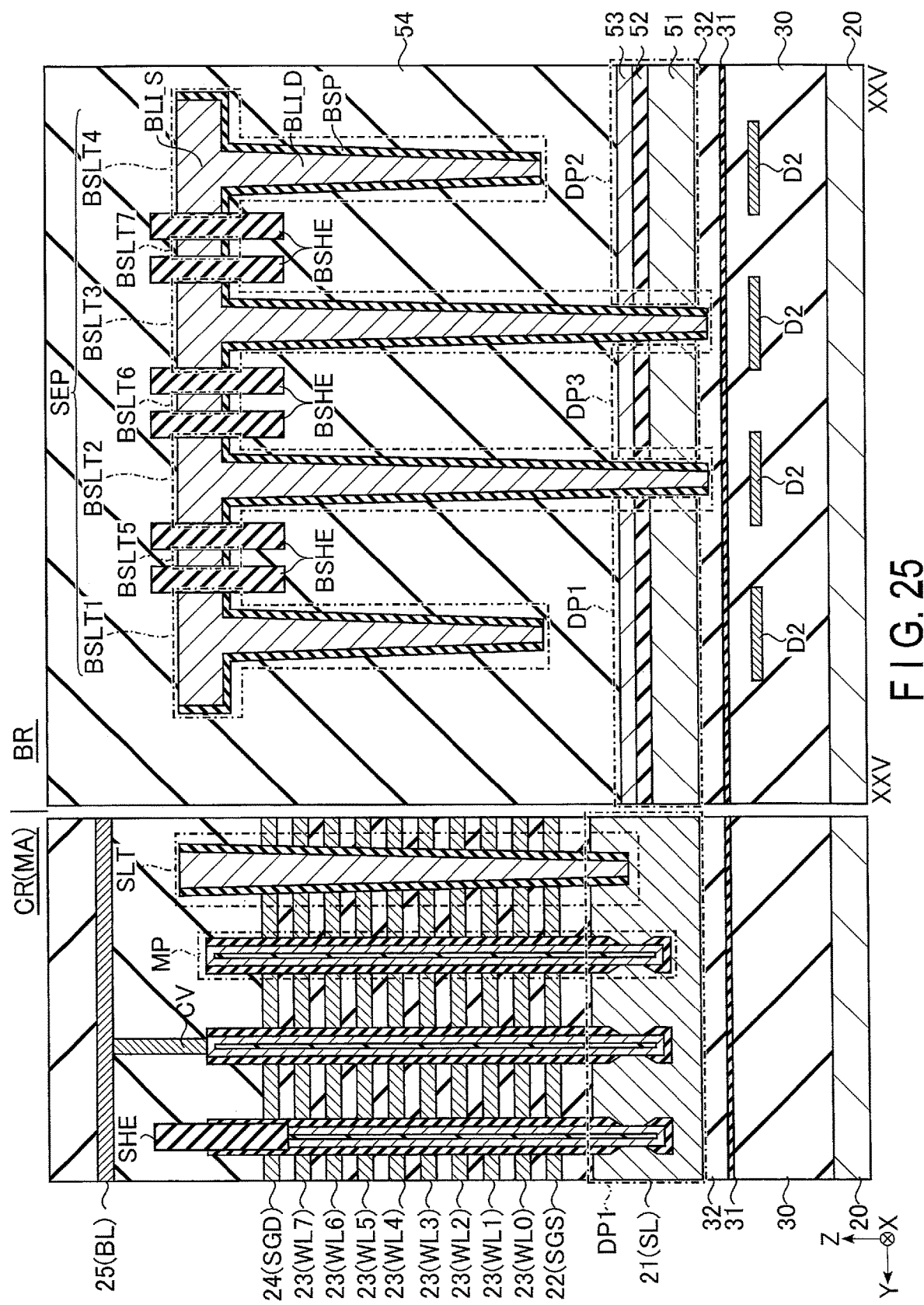
FIG. 25 shows a sectional view showing an example of a sectional structure in the bridge region of the memory device according to the second embodiment, which is taken along a line XXV-XXV in FIG. 24, and a sectional view showing an example of a sectional structure in the memory region.

FIG. 25 shows a sectional view showing an example of a sectional structure in the bridge region of the memory device according to the second embodiment, which is taken along a line XXV-XXV in FIG. 24, and a sectional view showing an example of a sectional structure in the memory region. FIG. 25 corresponds to FIG. 10 in the first embodiment.

As shown in FIG. 25, the lower end of the conductor film BLI_S included in each of the portions BSLT1 to BSLT7 is located on the upper side of an uppermost conductor layer 23. The upper end of the conductor film BLI_S included in each of the portions BSLT1 to BSLT7 is located at the same height as the upper end of a member SLT.

The lower end of each member BSHE is located between a conductor layer 24 and the uppermost conductor layer 23, and located on the lower side of the conductor film BLI_S. The upper end of each member BSHE is located on the upper side of the conductor film BLI_S. The upper end of each member BSHE is located at the same height as the upper end of a member SHE.

2.3 Effect According to Second Embodiment

According to the second embodiment, the two members BSHE are provided between the portion BSLT2 and the portion BSLT3. Hence, a source line SL (portion DP1) is protected with respect to the portion DP2 by a withstand voltage corresponding to the sum of the film thicknesses of the spacer BSP in the portion BSLT2, the two members BSHE, and the spacer BSP in the portion BSLT3. For this reason, the withstand voltage of the source line SL with respect to the portion DP3 can further be improved. It is therefore possible to improve the yield of the memory device 3.

3. Third Embodiment

A memory device 3 according to the third embodiment will be described next. The memory device 3 according to the third embodiment is different from the memory device 3 according to the first embodiment in that replacement processing is not executed for a portion DP1 of a conductive portion DP. In the following explanation, a description of the same configuration and manufacturing method as in the first embodiment will be omitted, and a configuration and a manufacturing method different from the first embodiment will mainly be described.

3.1 Sectional Structure of Bridge Region

Figure 26:
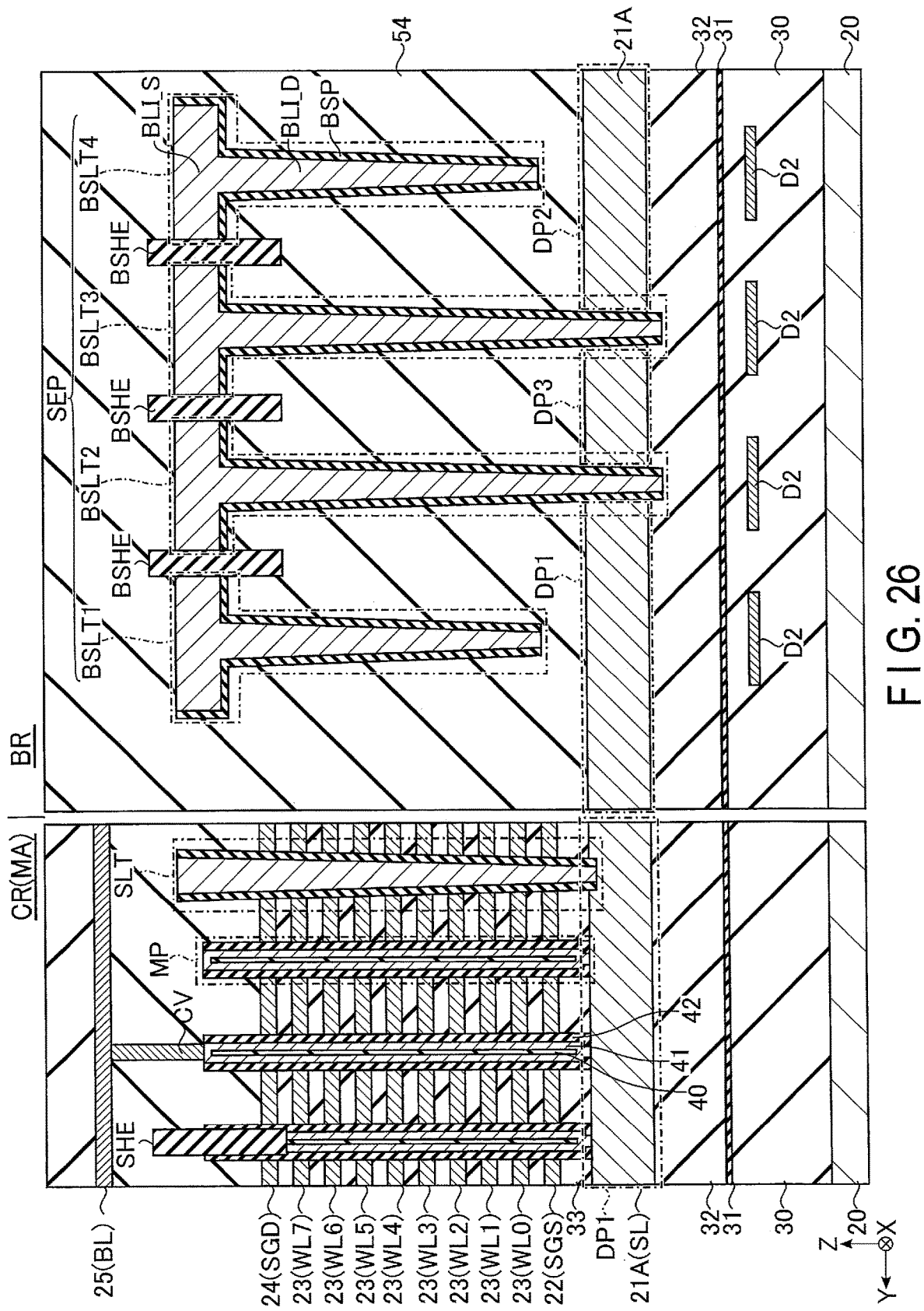
FIG. 26 is a sectional view showing an example of a sectional structure in the bridge region and the memory region of a memory device according to the third embodiment.

FIG. 26 is a sectional view showing an example of a sectional structure in the bridge region and the memory region of the memory device according to the third embodiment. FIG. 26 corresponds to FIG. 10 in the first embodiment.

As shown in FIG. 26, on the upper surface of an insulator layer 32, a conductor layer 21A is provided over a core region CR, a bridge region BR, and a kerf region KR (not shown). The conductor layer 21A corresponds to the conductive portion DP. The conductor layer 21A contains, for example, polysilicon. The conductor layer 21A may be a stacked layer structure including a metal layer and a polysilicon layer provided on the upper surface of the metal layer.

The core region CR will be described. In the core region CR, an insulator layer 33 is provided on the upper surface of the conductor layer 21A. The bottom portion of each memory pillar MP reaches the conductor layer 21A. A part of a semiconductor film 41 contacts the conductor layer 21A via the lower end of the memory pillar MP. A stacked film 42 covers the side surface and the bottom surface of the semiconductor film 41 except the portion where the semiconductor film 41 and the conductor layer 21A are in contact. Also, the lower end of a contact LI in a member SLT contacts the conductor layer 21A.

The bridge region BR will be described. In the bridge region BR, an insulator layer 54 is provided on the upper surface of the conductor layer 21A. Each of portions BSLT2 and BSLT3 of a member SEP divides the conductor layer 21A. On the other hand, each of portions BSLT1 and BSLT4 of the member SEP does not divide the conductor layer 21A. Hence, the conductor layer 21A is divided into portions DP1, DP2, and DP3.

3.2 Effect According to Third Embodiment

According to the third embodiment, the conductive portion DP is formed not by conductor layers 21, 51, and 53 and an insulator layer 52 but by the conductor layer 21A. The semiconductor film 41 in the memory pillar MP contacts the conductor layer 21A not on the side surface but at the lower end. Also, the member SEP divides the conductor layer 21A into the portions DP1, DP2, and DP3. In this configuration as well, a source line SL (portion DP1) is protected with respect to the portion DP2 by a withstand voltage corresponding to the sum of the film thicknesses of a spacer BSP in the portion BSLT2, a member BSHE, and the spacer BSP in the portion BSLT3. It is therefore possible to obtain the same effect as in the first and second embodiments.

4. Others

In the above-described embodiments, a case in which the member SEP is divided into the four portions BSLT1 to BSLT4 has been described. However, the embodiment is not limited to this. For example, if the accuracy of the etching depth in the slits SH2 at the two ends of the plurality of slits SH2 arranged in the Y direction is guaranteed, that is, if the division of the conductive portion DP is guaranteed in the slits SH2 at the two ends of the plurality of slits SH2 arranged in the Y direction, the portions BSLT1 and BSLT4 need not be provided.

Also, in the above-described embodiments, a structure in which the memory device 3 is formed on one chip has been described as an example. However, the embodiment is not limited to this. For example, the memory device 3 may have a structure in which a chip on which the sense amplifier module 16 and the like are provided and a chip on which the memory cell array 10 is provided may be bonded. In this case, the plurality of conductor layers D2 need not be provided.

Additionally, in the above-described embodiments, a structure in which the word line WL and the selection gate line SGS are adjacent to each other, and the word line WL and the selection gate line SGD are adjacent to each other has been described. However, the embodiment is not limited to this. For example, a dummy word line may be provided between the word line WL of the uppermost layer and the selection gate line SGD. Similarly, a dummy word line may be provided between the word line WL of the lowermost layer and the selection gate line SGS.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A memory device comprising:
a substrate including a memory region, and an external region of the memory region;
a first conductor layer arranged in the memory region apart from the substrate in a first direction crossing a plane parallel to the substrate;
a second conductor layer arranged in the external region apart from the first conductor layer in a second direction in the plane;
a third conductor layer arranged in the external region apart from the second conductor layer on an opposite side of the first conductor layer with respect to the second conductor layer in the second direction;
a first member including in the external region, a first lower portion extending in the first direction between the first conductor layer and the second conductor layer and reaching a lower side of the first conductor layer and the second conductor layer, and a first upper portion including a side surface outside an extension of a side surface of the first lower portion on an upper side of the first lower portion;
a second member including in the external region, a second lower portion extending in the first direction between the second conductor layer and the third conductor layer and reaching a lower side of the second conductor layer and the third conductor layer, and a second upper portion including a side surface outside an extension of a side surface of the second lower portion on an upper side of the second lower portion, the second member being arranged apart from the first member in the second direction; and
a first insulating member including in the external region, a lower end located on a lower side of the first upper portion and the second upper portion, and an upper end located on an upper side of the first upper portion and the second upper portion, and extending in the first direction between the first upper portion and the second upper portion.

2. The device according to claim 1, further comprising:
a plurality of fourth conductor layers arranged in the memory region apart from each other in the first direction on an upper side of the first conductor layer; and
a pillar extending in the memory region in the first direction and being in contact with the first conductor layer, whose portions crossing the plurality of fourth conductor layers each function as a memory cell.

3. The device according to claim 2, further comprising:
a seventh conductor layer and an eighth conductor layer, which are arranged in the memory region apart from each other in the second direction on an upper side of the plurality of fourth conductor layers; and
a fifth insulating member including in the memory region, a lower end located between the seventh conductor layer and the eighth conductor layer and an upmost layer of the plurality of fourth conductor layers, and an upper end located on an upper side of the seventh conductor layer and the eighth conductor layer, and extending in the first direction between the seventh conductor layer and the eighth conductor layer,
wherein the lower end of the first insulating member is located between the seventh conductor layer and the eighth conductor layer and the upmost layer in the first direction, and
the upper end of the first insulating member is located on the upper side of the seventh conductor layer and the eighth conductor layer in the first direction.

4. The device according to claim 3, wherein an upper end of each of the first member and the second member is located on a lower side of the upper end of the fifth insulating member.

5. The device according to claim 2, wherein
each of the second conductor layer and the third conductor layer includes:
a first sub-conductor layer; and
a second sub-conductor layer arranged apart from the first sub-conductor layer in the first direction, and
the first conductor layer includes
a third sub-conductor layer different from the first sub-conductor layer and the second sub-conductor layer.

6. The device according to claim 5, wherein
the pillar includes a semiconductor film, and
the third sub-conductor layer is in contact with a side surface of the semiconductor film.

7. The device according to claim 1, wherein when viewed in the first direction, two ends of each of the first lower portion and the second lower portion along a third direction crossing the second direction in the plane are located outside the second conductor layer.

8. The device according to claim 7, wherein when viewed in the first direction, two ends of the first insulating member along the third direction are located outside each of the first upper portion and the second upper portion.

9. The device according to claim 1, further comprising:
a third member including in the external region, a third lower portion extending in the first direction, and a third upper portion including a side surface outside an extension of a side surface of the third lower portion on an upper side of the third lower portion, the third member being arranged apart from the second member on an opposite side of the first member with respect to the second member in the second direction; and
a fourth member including in the external region, a fourth lower portion extending in the first direction, and a fourth upper portion including a side surface outside an extension of a side surface of the fourth lower portion on an upper side of the fourth lower portion, the fourth member being arranged apart from the first member on an opposite side of the second member with respect to the first member in the second direction.

10. The device according to claim 9, further comprising:
a second insulating member including in the external region, a lower end located on a lower side of the second upper portion and the third upper portion, and an upper end located on an upper side of the second upper portion and the third upper portion, and extending in the first direction between the second upper portion and the third upper portion; and
a third insulating member including in the external region, a lower end located on a lower side of the first upper portion and the fourth upper portion, and an upper end located on an upper side of the first upper portion and the fourth upper portion, and extending in the first direction between the first upper portion and the fourth upper portion.

11. The device according to claim 9, wherein the third lower portion is located on an upper side of the third conductor layer and is apart from the third conductor layer in the first direction.

12. The device according to claim 9, wherein the third lower portion is in contact with the third conductor layer.

13. The device according to claim 9, wherein the fourth lower portion is located on an upper side of the first conductor layer and is apart from the first conductor layer in the first direction.

14. The device according to claim 9, wherein the fourth lower portion is in contact with the first conductor layer.

15. The device according to claim 1, wherein
the first member includes:
a first conductor film; and
a first insulator film provided between the first conductor film and the first conductor layer, and between the first conductor film and the second conductor layer, and
the second member includes:
a second conductor film; and
a second insulator film provided between the second conductor film and the second conductor layer, and between the second conductor film and the third conductor layer.

16. The device according to claim 15, wherein the first conductor film and the second conductor film are in contact with the first insulating member.

17. The device according to claim 15, further comprising a fourth insulating member including, in the external region, a lower end located on the lower side of the first upper portion and the second upper portion, and an upper end located on the upper side of the first upper portion and the second upper portion, extending in the first direction between the first upper portion and the second upper portion, the fourth insulating member being arranged apart from the first insulating member in the second direction.

18. The device according to claim 17, further comprising:
a third conductor film between the first insulating member and the fourth insulating member,
wherein the first conductor film is in contact with the first insulating member,
the second conductor film is in contact with the fourth insulating member, and
the third conductor film is in contact with the first insulating member and the fourth insulating member.

19. The device according to claim 1, further comprising:
a fifth conductor layer provided on a lower side of the first lower portion, in a region including the first lower portion when viewed in the first direction; and
a sixth conductor layer provided on a lower side of the second lower portion, in a region including the second lower portion when viewed in the first direction.

* * * * *